US009721963B1

(12) United States Patent
Rabkin et al.

(10) Patent No.: US 9,721,963 B1
(45) Date of Patent: Aug. 1, 2017

(54) THREE-DIMENSIONAL MEMORY DEVICE HAVING A TRANSITION METAL DICHALCOGENIDE CHANNEL

(71) Applicant: SANDISK TECHNOLOGIES INC., Plano, TX (US)

(72) Inventors: Peter Rabkin, Cupertino, CA (US); Masaaki Higashitani, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/094,552

(22) Filed: Apr. 8, 2016

(51) Int. Cl.
| H01L 23/00 | (2006.01) |
| H01L 27/00 | (2006.01) |
| H01L 29/00 | (2006.01) |
| H01L 27/1157 | (2017.01) |
| H01L 27/11582 | (2017.01) |
| H01L 29/15 | (2006.01) |
| H01L 29/24 | (2006.01) |
| H01L 29/10 | (2006.01) |
| H01L 23/522 | (2006.01) |

(52) U.S. Cl.
CPC ...... *H01L 27/1157* (2013.01); *H01L 23/5226* (2013.01); *H01L 27/11582* (2013.01); *H01L 29/1037* (2013.01); *H01L 29/155* (2013.01); *H01L 29/24* (2013.01)

(58) Field of Classification Search
CPC ............. H01L 23/5226; H01L 27/1157; H01L 27/11582; H01L 27/11597; H01L 29/155; H01L 29/24; H01L 29/1037; H01L 23/5283; H01L 23/535; H01L 33/58
See application file for complete search history.

(56) References Cited

U.S. PATENT DOCUMENTS

| 4,711,858 A | 12/1987 | Harder et al. |
| 5,141,893 A | 8/1992 | Ito et al. |
| (Continued) |

FOREIGN PATENT DOCUMENTS

JP 2010-509177 3/2010

OTHER PUBLICATIONS

U.S. Appl. No. 14/733,335, Jun. 8, 2015, SanDisk Technologies Inc.
(Continued)

*Primary Examiner* — Nikolay Yushin
(74) *Attorney, Agent, or Firm* — The Marbury Law Group PLLC

(57) ABSTRACT

A monolithic three-dimensional memory device contains a high mobility metal dichalcogenide channel. A stack of alternating layers comprising first material layers and second material layers is formed over a substrate. A memory opening is formed through the stack of alternating layers. A memory film is formed in the memory opening. A metal dichalcogenide channel is formed on an inner sidewall of the memory film. A dielectric core is formed within the metal dichalcogenide channel. A stack of titanium and gold may be employed to form a drain region to enhance contact. A hafnium oxide, aluminum oxide or hafnium aluminum oxide hafnium aluminum oxide layer may be employed on either side, or on both sides, of the metal dichalcogenide channel to enhance the mobility of electrons in the metal dichalcogenide channel.

31 Claims, 18 Drawing Sheets

(56) References Cited

U.S. PATENT DOCUMENTS

| | | | |
|---|---|---|---|
| 5,212,113 | A | 5/1993 | Azoulay et al. |
| 5,244,834 | A | 9/1993 | Suzuki et al. |
| 5,346,848 | A | 9/1994 | Grupen-Shemansky et al. |
| 5,402,748 | A | 4/1995 | Takai et al. |
| 5,456,206 | A | 10/1995 | Lee et al. |
| 5,993,542 | A | 11/1999 | Yanashima et al. |
| 6,498,048 | B2 | 12/2002 | Morita |
| 6,508,879 | B1 | 1/2003 | Hashimoto |
| 6,727,523 | B2 | 4/2004 | Morita |
| 7,078,318 | B2 | 7/2006 | Jurgensen et al. |
| 7,928,427 | B1 | 4/2011 | Chang |
| 7,955,437 | B2 | 6/2011 | Shibata et al. |
| 8,603,898 | B2 | 12/2013 | Bao et al. |
| 9,337,210 | B2 * | 5/2016 | Karda ............... H01L 21/28291 |
| 2008/0113496 | A1 | 5/2008 | Keller et al. |
| 2012/0049267 | A1 | 3/2012 | Jung |
| 2013/0100722 | A1 | 4/2013 | Shin |
| 2015/0041873 | A1 * | 2/2015 | Karda ............... H01L 21/28291 257/295 |

OTHER PUBLICATIONS

U.S. Appl. No. 14/733,244, Jun. 8, 2015, SanDisk Technologies Inc.

Kim et al., "High-mobility and Low-Power Thin-Film Transistors based on Multilayer $MoS_2$ Crystals," Nature Communications, Aug. 21, 2012;3:1011.

Wang et al., "Integrated Circuits Based on Bilayer $MoS_2$ Transistors," *Nano letters* 12, No. 9 (2012): 4674-4680.

Radisavljevic et al., "Single-layer $MoS_2$ Transistors," Nature Nanotechnology, vol. 6, Mar. 2011, pp. 147-150.

Song et al., "Controllable Synthesis of Molybdenum Tungsten Disulfide Alloy for Vertically Composition-Controlled Multilayer," Nature Communications, Jul. 23, 2015;6.

* cited by examiner

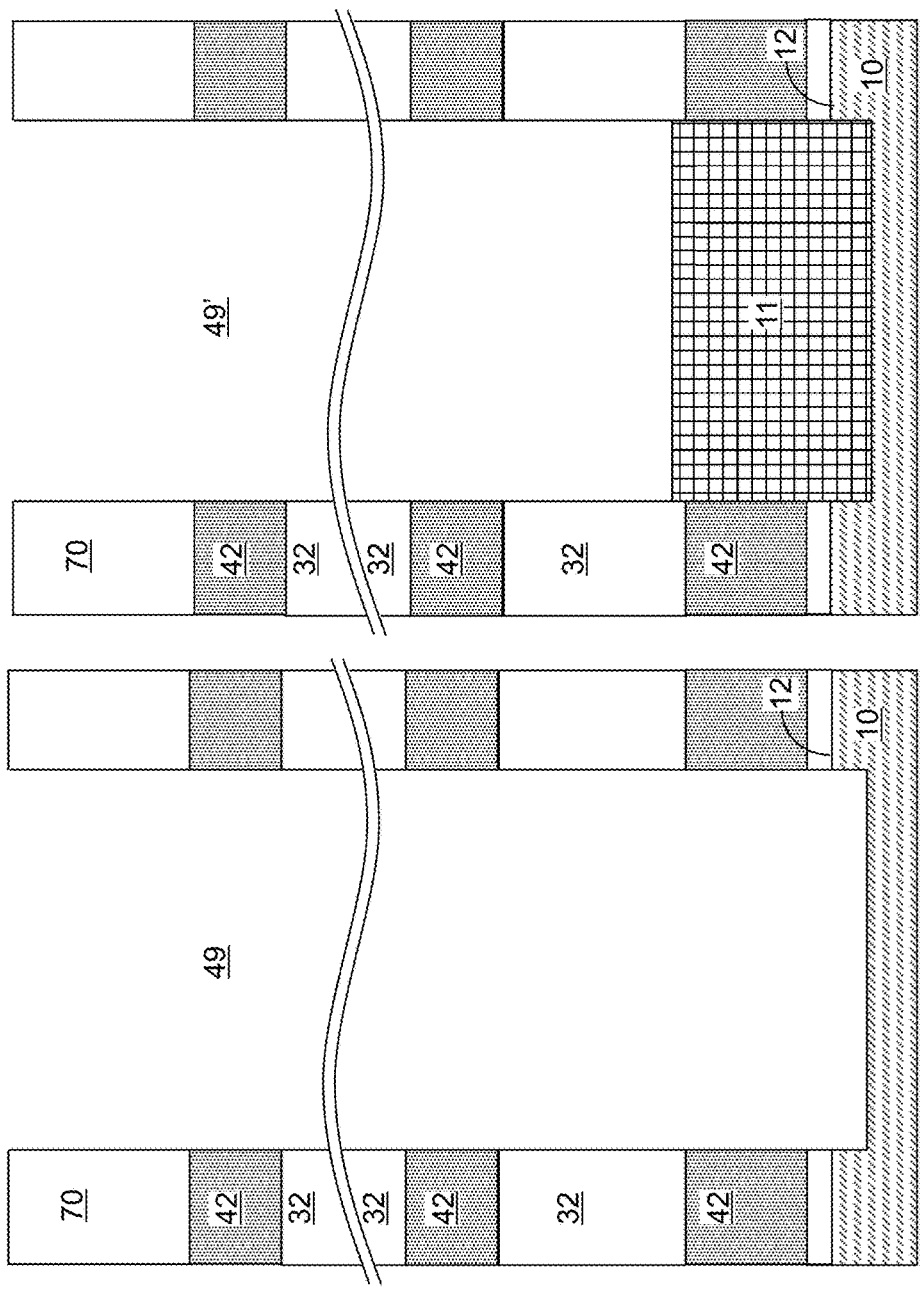

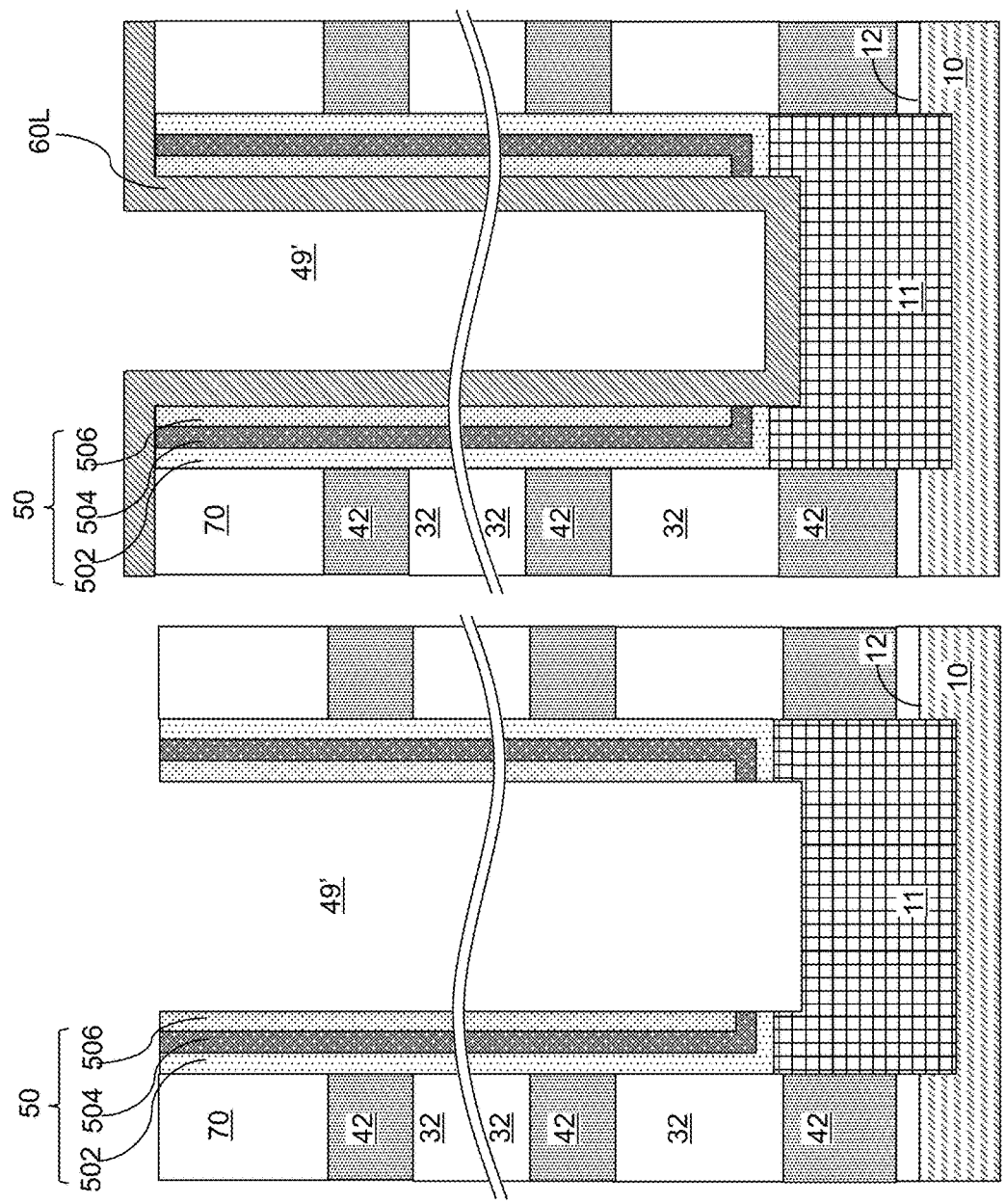

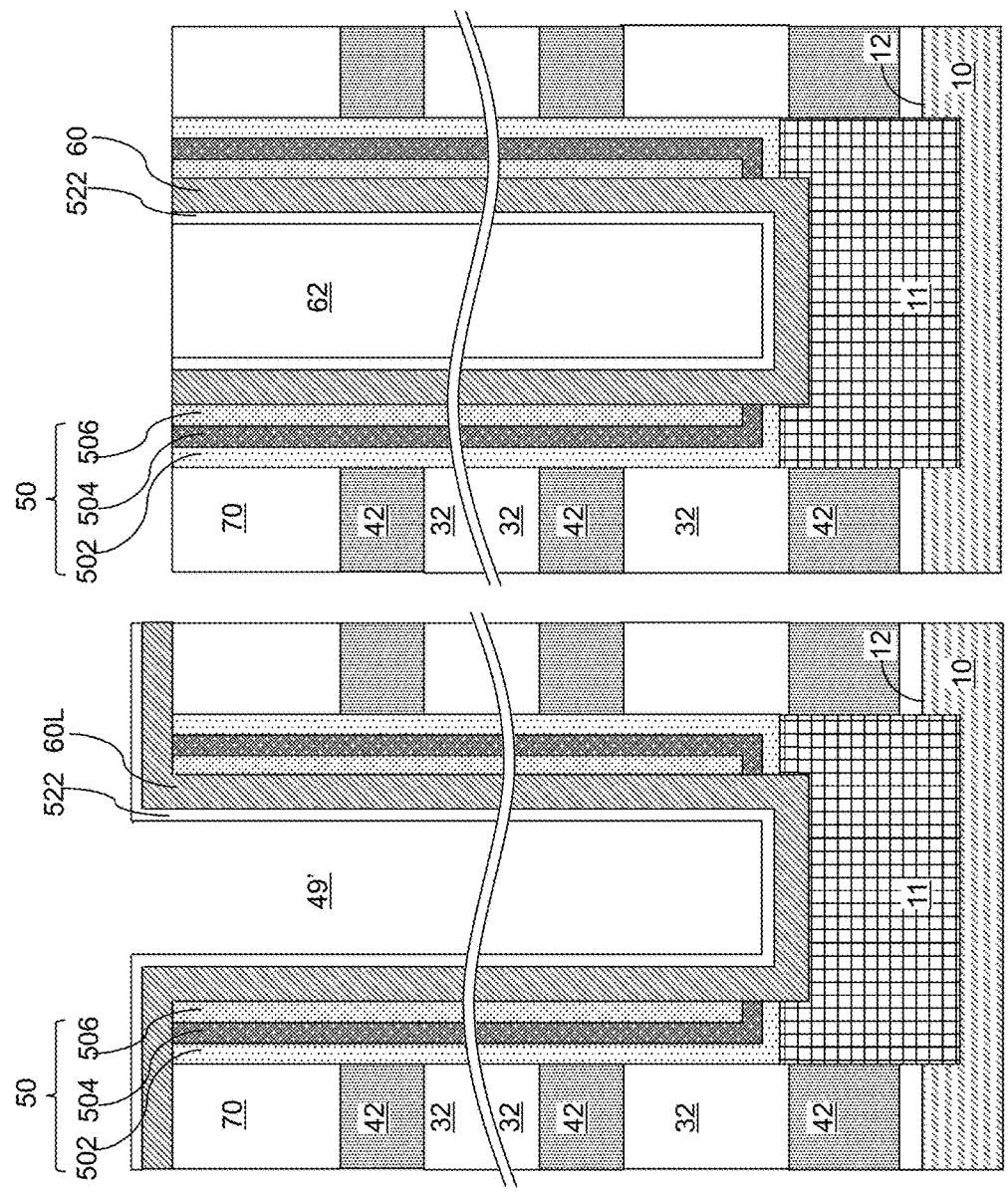

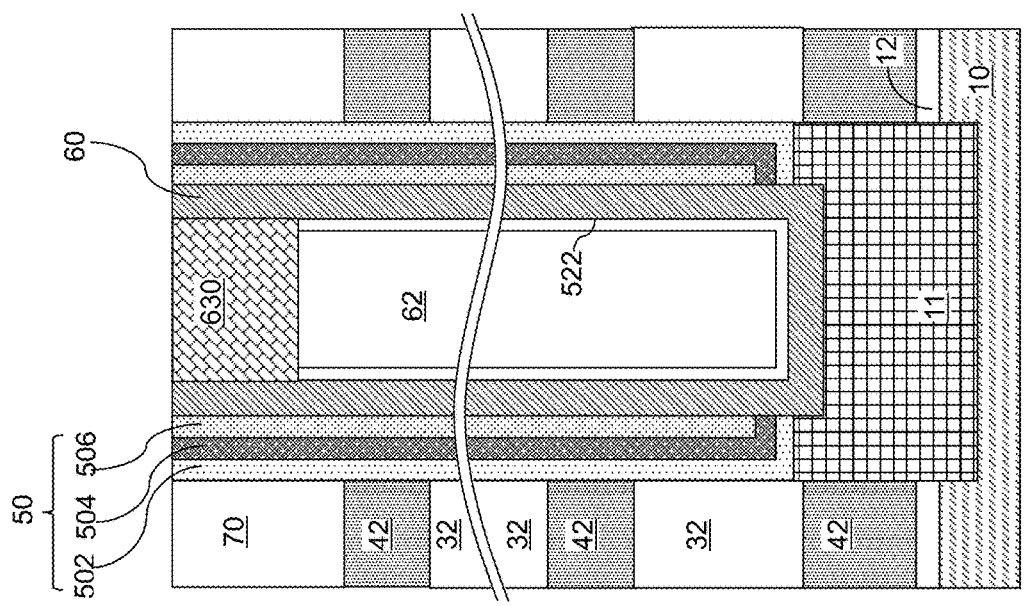
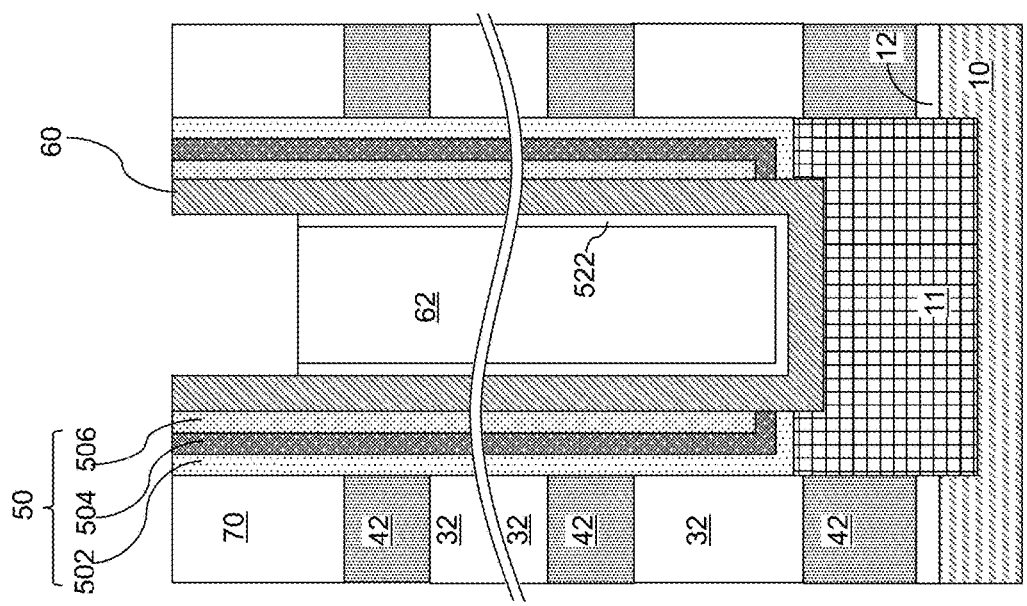

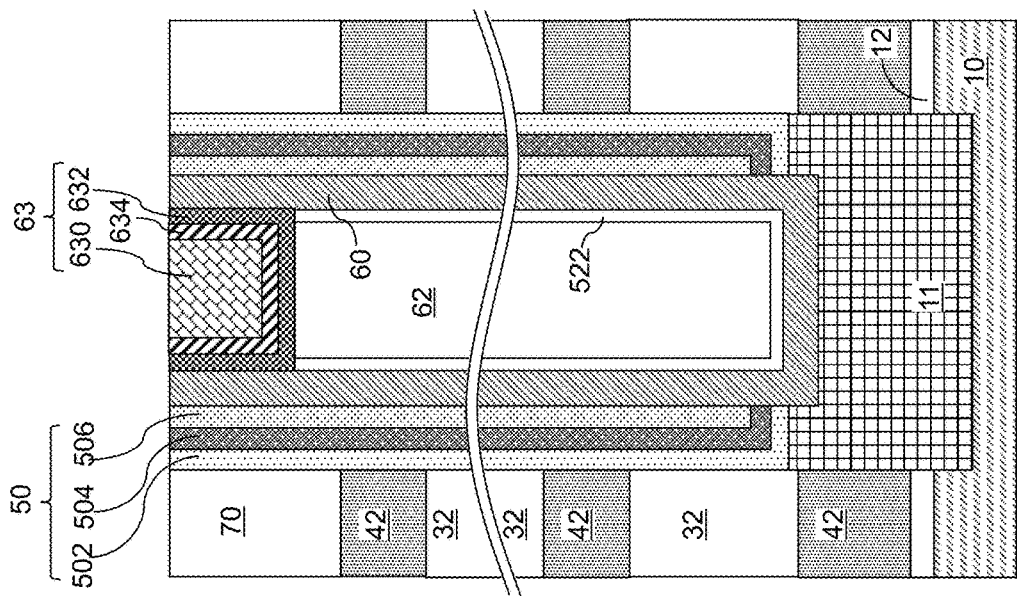
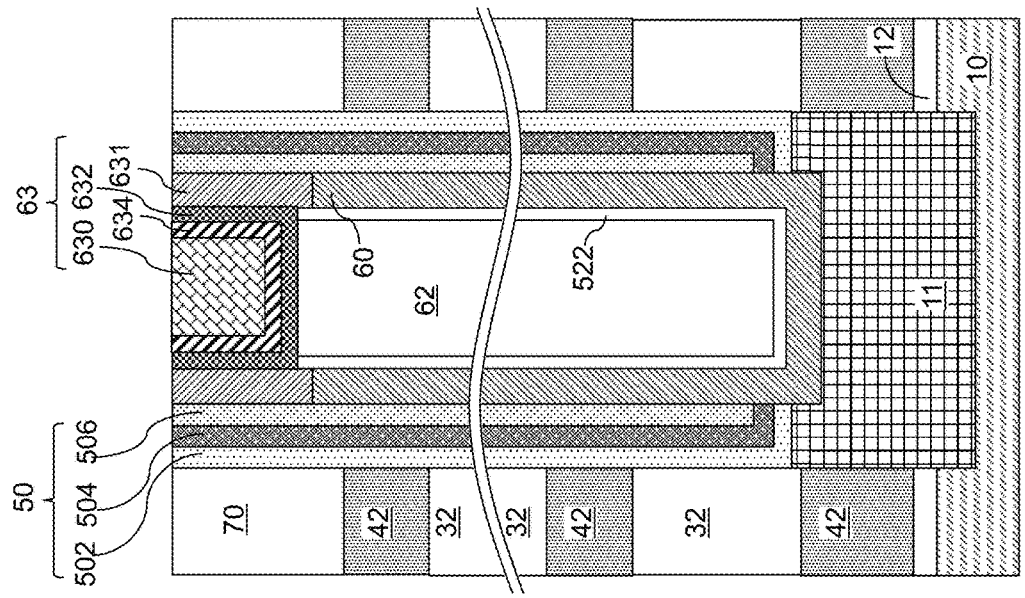

THREE-DIMENSIONAL MEMORY DEVICE HAVING A TRANSITION METAL DICHALCOGENIDE CHANNEL

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36. In a conventional process flow, a 2-film semiconductor channel is formed. The first semiconductor channel layer typically includes a "cover" amorphous silicon layer that covers a tunneling dielectric layer during an anisotropic etch that physically exposes an underlying semiconductor material at the bottom of a memory opening, and the second semiconductor channel layer includes a "body" amorphous silicon layer. The total thickness of the semiconductor channel is typically in a range from 15 nm to 20 nm.

One issue with a semiconductor channel employing two layers of amorphous silicon is that a defective interface is formed between a first polysilicon layer derived from the cover amorphous silicon layer and a second polysilicon layer derived from the body amorphous silicon layer. Such a defective interface leads to degradation of charge carrier mobility and cell current. The defects at the interface between two polysilicon films and defects at grain boundaries, typical for polysilicon, are detrimental to various device performance parameters such as cell current, sub-threshold slope and boosting potential.

In addition, re-sputtered etch ions damage the cover amorphous silicon layer during the anisotropic etch that forms an opening through the cover amorphous silicon layer. Since the cover amorphous silicon layer is converted into a portion of the semiconductor channel, the plasma damage remains within the semiconductor channel. Thus, the quality of the semiconductor channel, as measured by performance, variability and reliability, is degraded.

SUMMARY

According to an aspect of the present disclosure, a monolithic three-dimensional memory device is provided, which comprises a stack of alternating layers comprising insulating layers and electrically conductive layers located over a substrate; a memory opening vertically extending through the stack of alternating layers; a memory film located at a periphery of the memory opening; and a metal dichalcogenide channel extending through the memory opening and located inside the memory film.

According to another aspect of the present disclosure, a method of forming a monolithic three-dimensional memory device is provided. A stack of alternating layers comprising first material layers and second material layers is formed over a substrate. A memory opening is formed through the stack of alternating layers. A memory film is formed in the memory opening. A metal dichalcogenide channel extending through the memory opening is formed on an inner sidewall of the memory film.

BRIEF DESCRIPTION OF THE DRAWINGS

FIGS. 3A-3J are sequential vertical cross-sectional views of a memory opening during formation of a first exemplary memory stack structure according to a first embodiment of the present disclosure.

FIGS. 4A-4C are sequential vertical cross-sectional views of a memory opening during formation of a second exemplary memory stack structure according to a second embodiment of the present disclosure.

FIG. 4D is an alternative embodiment of the second exemplary stack structure according to the second embodiment of the present disclosure.

DETAILED DESCRIPTION

Figure 1:
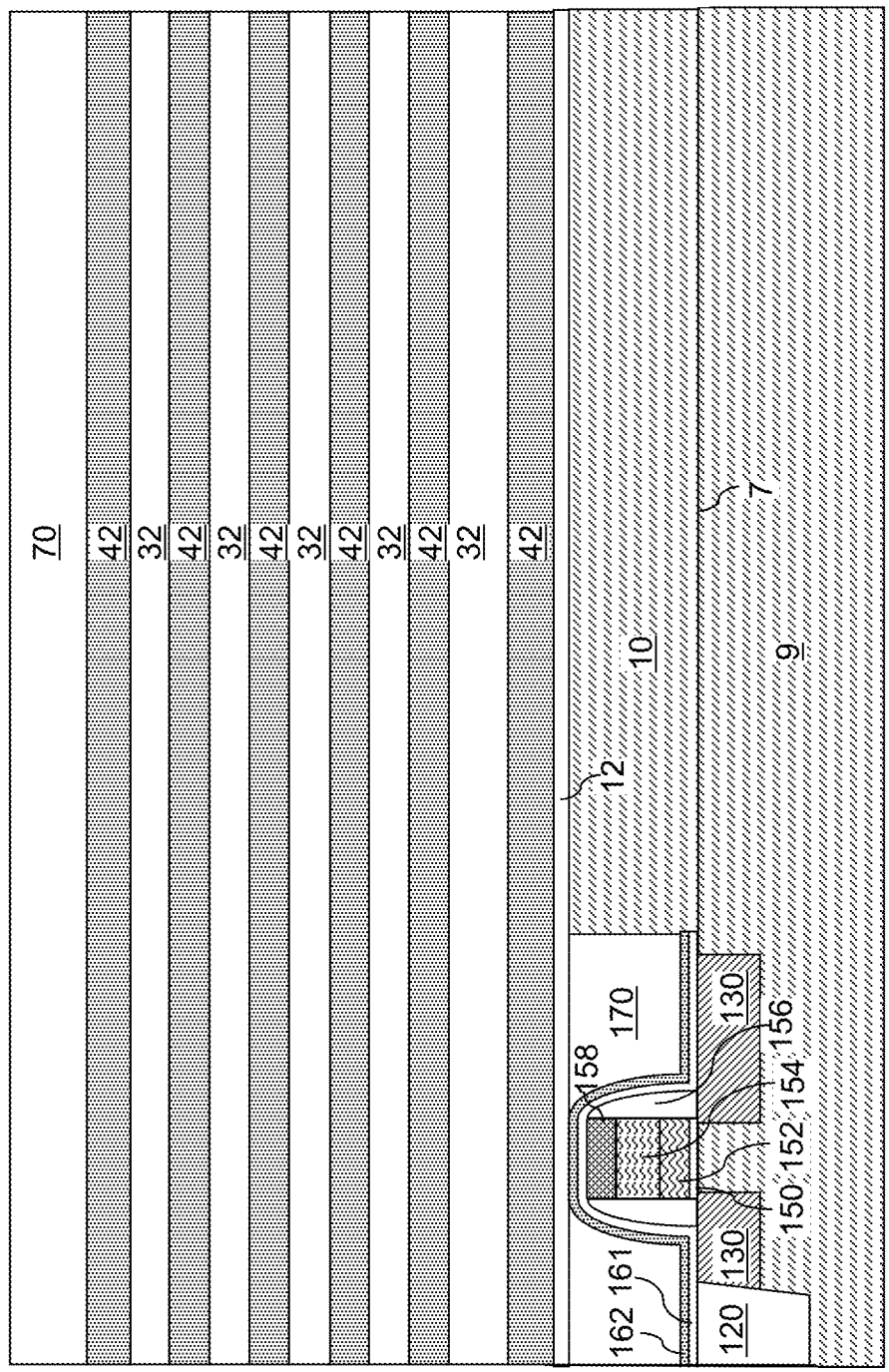
FIG. 1 is a vertical cross-sectional view of an exemplary device structure after formation of a stack including an alternating plurality of material layers according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure, or at or on a sidewall surface or a tapered surface. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The inventors of the present disclosure realized that the issue of low cell current in advanced three-dimensional (3D) NAND memory device can be solved or alleviated by employing a two-dimensional (2D) metal dichalcogenide channel. The two-dimensional metal dichalcogenide channel can be realized by employing a metal dichalcogenide material, which can have a thickness not greater than eight atomic layers, and preferably not greater than five atomic layers, and even more preferably not greater than three-atomic layers. Such a thin metal dichalcogenide material displays characteristics of a two-dimensional channel providing high charge carrier mobility. For example, a $MoS_2$ channel can have field limited mobility up to about 200 $cm^2/Vs$. This is more than an order of magnitude higher than the field limited mobility in conventional polysilicon channel. A metal dichalcogenide channel can provide lower leakage, better boosting, less program disturb, and smaller power consumption.

In addition, the inventors of the present disclosure realized that an interfacial layer including a specific type of a high dielectric constant (high-k) dielectric material can be employed to improve the interface quality between a tunneling dielectric layer and the metal dichalcogenide channel, thus further enhancing the channel mobility. The metal dichalcogenide channel can provide another benefit of reducing operational voltages, and thus, reduce the power consumption of the 3D NAND memory device.

Referring to FIG. 1, an exemplary device structure according to an embodiment of the present disclosure is illustrated, which can be employed, for example, to fabricate a device structure containing vertical NAND memory devices. The exemplary device structure includes a substrate, which can be a semiconductor substrate (e.g., a single crystal silicon wafer). The substrate can include a substrate semiconductor layer 9. The substrate semiconductor layer 9 is a semiconductor material layer, and can include at least one elemental semiconductor material (e.g., single crystal silicon), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. A material is "semiconducting" if the electrical conductivity is in a range from $1.0 \times 10^{-6}$ S/cm to $1.0 \times 10^5$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The at least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170. The semiconductor material layer 10 can be doped with p-type dopants or n-type dopants. The type of doping of the semiconductor material layer 10 is herein referred to as a first conductivity type. In case a semiconductor material layer 10 is not formed, the substrate semiconductor layer can be doped with p-type dopants or n-type dopants, and the type of doping of the substrate semiconductor layer 9 is referred to as a first conductivity type. In one embodiment, the first conductivity type can be p-type.

Optionally, a dielectric layer 12 can be formed above the semiconductor material layer 10 and the planarization dielectric layer 170. The dielectric layer 12 is sometimes referred to as "gate dielectric layer" since a portion of this layer may comprise a horizontal portion of gate dielectric for the bottommost select gate transistor (select gate source transistor) in vertical NAND string. The dielectric layer 12 can be, for example, silicon oxide layer. The thickness of the dielectric layer 12 can be in a range from 3 nm to 30 nm, although lesser and greater thicknesses can also be employed.

A stack of an alternating plurality of first material layers (which can be insulating layers 32) and second material layers (which are spacer material layers located between the first material layers 32 and may be sacrificial material layer 42) is formed over the top surface of the substrate. For example, the stack of the alternating plurality of first material layers and second material layers can be formed on the top surface of the dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide and/or organosilicate glass.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium. Alternatively, permanent electrically conductive layers may be employed in lieu of the sacrificial material layers 42. The permanent electrically conductive layers may comprise a conductive material such as a metal, polysilicon, a metal silicide (e.g., NiSi). In this case, the permanent electrically conductive layers are not replaced with a different material, and serve as control gate electrodes of vertical NAND device.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
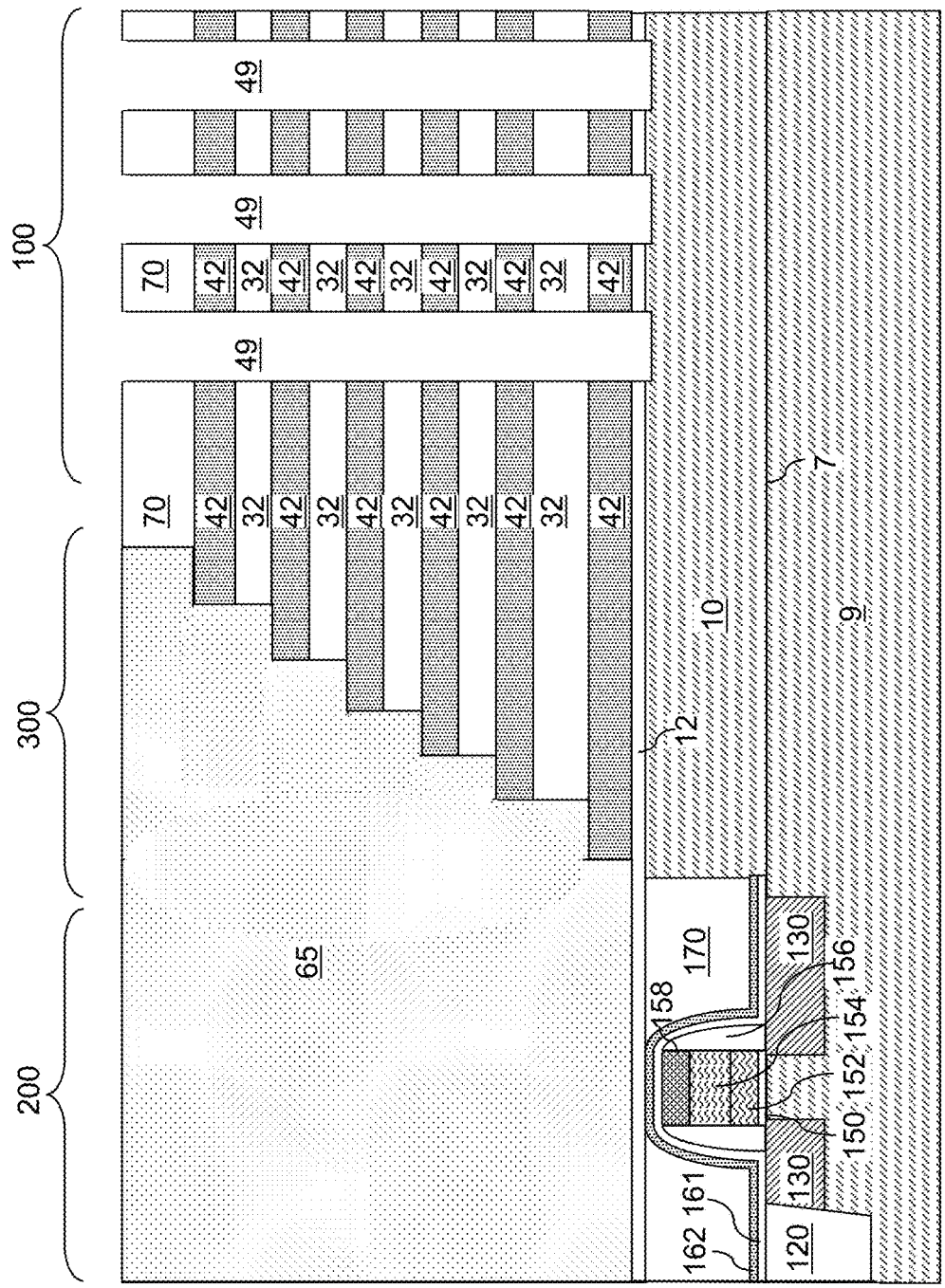
FIG. 2 is a vertical cross-sectional view of the exemplary device structure after formation of a retro-stepped dielectric material portion and memory openings according to an embodiment of the present disclosure.

Referring to FIG. 2, a stepped cavity can be formed within a contact region 300 which is located adjacent to a device region 100. The cavity can also optionally be formed in a peripheral device region 200. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

A remaining peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric layer 12 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric layer 12 so that the memory openings 49 extend from the top surface of the alternating stack (32, 42) to the top surface of the semiconductor material layer 10 within the substrate between the lower select gate electrodes. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can extend to a top surface of the substrate semiconductor layer 9.

A memory stack structure can be formed in each of the memory opening employing various embodiments of the present disclosure. FIGS. 3A-3J illustrate sequential vertical cross-sectional views of a memory opening within the exemplary device structure during formation of a first exemplary memory stack structure according to a first embodiment of the present disclosure. Formation of the exemplary memory stack structure can be performed within each of the memory openings 49 in the exemplary device structure illustrated in FIG. 2.

Referring to FIG. 3A, a memory opening 49 in the exemplary device structure of FIG. 2 is illustrated. The memory opening 49 extends through the insulating cap layer 70, the alternating stack (32, 42), the dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 3B, an optional epitaxial pedestal 11 can be formed at the bottom portion of each memory opening 49, for example, by selective epitaxy. Each epitaxial pedestal 11 comprises a single crystalline semiconductor material in epitaxial alignment with the single crystalline semiconductor material of the semiconductor material layer 10. In one embodiment, the epitaxial pedestal 11 can be doped with electrical dopants of the same conductivity type as the semiconductor material layer 10. In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer. The epitaxial pedestal 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial pedestal 11. In one embodiment, the epitaxial pedestal 11 can comprise single crystalline silicon. In one embodiment, the epitaxial pedestal 11 can have a doping of the first conductivity type, which is the same as the conductivity type of the semiconductor material layer 11 that the epitaxial pedestal contacts. If a semiconductor material layer 10 is not present, the epitaxial pedestal 11 can be formed directly on the substrate semiconductor layer 9, which can have a doping of the first conductivity type.

Figures 3C, 3D:
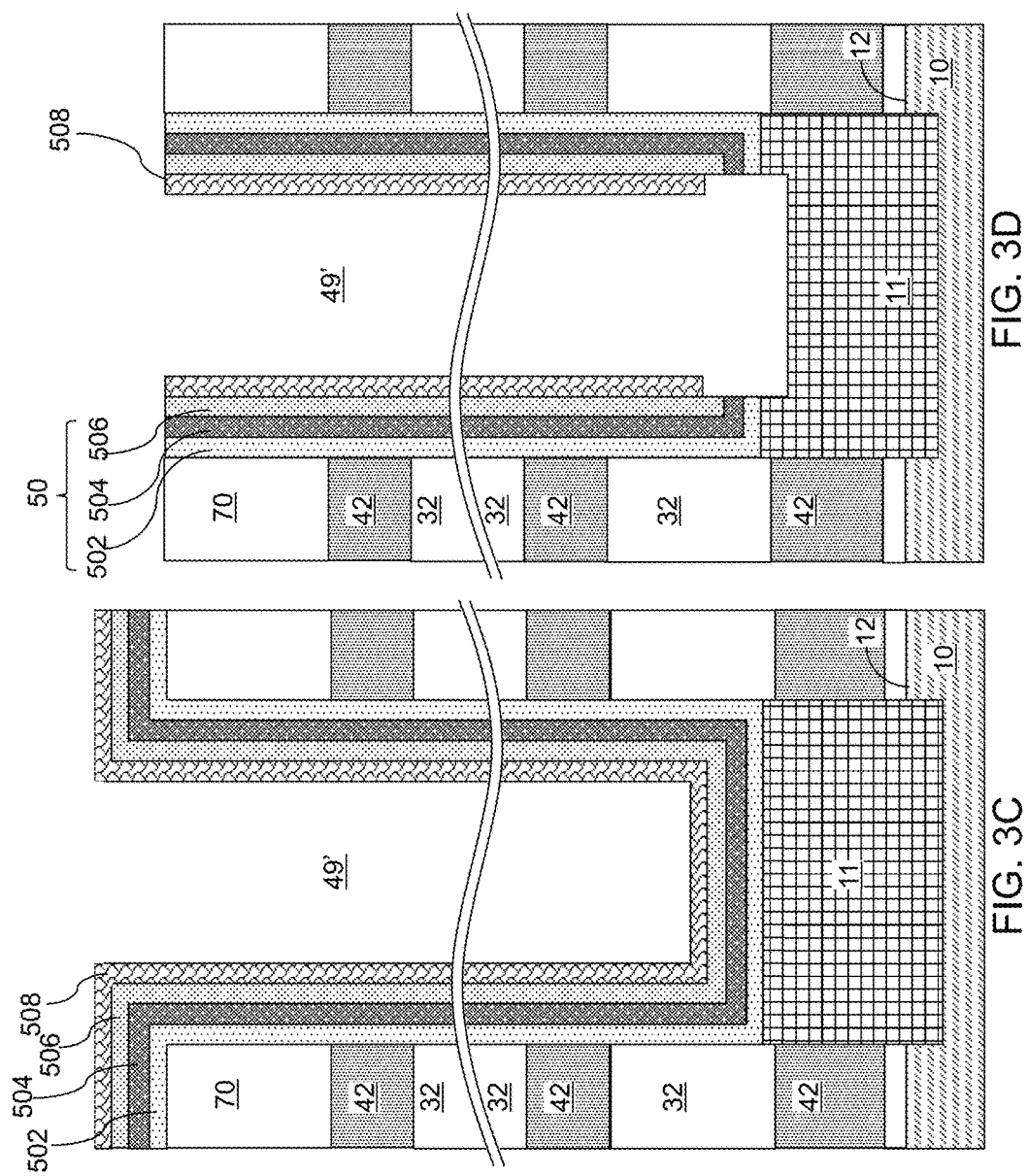

Referring to FIG. 3C, a stack of layers including a blocking dielectric layer 502, a charge storage layer 504, a tunneling dielectric layer 506, and an optional sacrificial cover layer 508 can be sequentially deposited in the memory openings 49.

The blocking dielectric layer 502 can be deposited on the sidewalls of each memory opening 49 by a conformal deposition method. The blocking dielectric layer 502 includes a dielectric material, which can be silicon oxide, silicon oxynitride, silicon nitride, a dielectric metal oxide, or a combination thereof. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 502 can include a dielectric metal oxide having a dielectric constant greater than 7.9, i.e., having a dielectric constant greater than the dielectric constant of silicon nitride.

The blocking dielectric layer 502 can be formed by a conformal deposition method such as low pressure chemical vapor deposition, atomic layer deposition, or a combination thereof. The thickness of the blocking dielectric layer 502 can be in a range from 1 nm to 40 nm, although lesser and greater thicknesses can also be employed. The blocking dielectric layer 502 can subsequently function as a dielectric material portion that blocks leakage of stored electrical charges to control gate electrodes. In one embodiment, the blocking dielectric layer 502 includes aluminum oxide. Alternately or additionally, another blocking dielectric layer can be formed after formation of backside recesses on outer surfaces of memory films to be subsequently formed. In case an additional blocking dielectric layer is subsequently formed, the blocking dielectric layer 502 can be omitted.

Subsequently, the charge storage layer 504 can be formed. In one embodiment, the charge storage layer 504 can be a continuous layer or patterned discrete portions of a charge trapping material including a dielectric charge trapping material, which can be, for example, silicon nitride. Alternatively, the charge storage layer 504 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 504 includes a silicon nitride layer. In one embodiment, the sacrificial material layers 42 and the insulating layers 32 can have vertically coincident sidewalls, and the charge storage layer 504 can be formed as a single continuous layer. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

In another embodiment, the sacrificial material layers 42 can be laterally recessed with respect to the sidewalls of the insulating layers 32, and a combination of a deposition process and an anisotropic etch process can be employed to form the charge storage layer 504 as a plurality of memory material portions that are vertically spaced apart. While the present disclosure is described employing an embodiment in which the charge storage layer 504 is a single continuous layer, embodiments are expressly contemplated herein in which the charge storage layer 504 is replaced with a plurality of memory material portions (which can be charge trapping material portions or electrically isolated conductive material portions) that are vertically spaced apart.

The charge storage layer 504 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 504 may comprise an insulating charge trapping material, such as one or more silicon nitride segments. Alternatively, the charge storage layer 504 may comprise conductive nanoparticles such as metal nanoparticles, which can be, for example, ruthenium nanoparticles. The charge storage layer 504 can be formed, for example, by chemical vapor deposition (CVD), atomic layer deposition (ALD), physical vapor deposition (PVD), or any suitable deposition technique for storing electrical charges therein. The thickness of the charge storage layer 504 can be in a range from 2 nm to 20 nm, although lesser and greater thicknesses can also be employed.

The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack. In one embodiment, the tunneling dielectric layer 506 can include a silicon oxide layer that is substantially free of carbon or a silicon oxynitride layer that is substantially free of carbon. The thickness of the tunneling dielectric layer 506 can be in a range from 2 nm to 10 nm, although lesser and greater thicknesses can also be employed.

In one embodiment, the tunneling dielectric layer 506 can be optimized for a metal dichalcogenide channel containing a cylindrical confinement electron gas. In one embodiment, the tunneling dielectric layer 506 can include an innermost layer that includes a high-k dielectric material. In one embodiment, the tunneling dielectric layer 506 can include an innermost layer that includes a hafnium oxide, aluminum oxide or hafnium aluminum oxide layer ($Hf_{3x}Al_{4-4x}O_{6+\delta}$; $0<x<1$, and $-1<\delta<1$) and at least one outer layer that includes a dielectric material different from the above metal oxide layer. In case the hafnium oxide, aluminum oxide or hafnium aluminum oxide layer is present in the tunneling dielectric layer 506, the hafnium oxide, aluminum oxide or hafnium aluminum oxide layer can enhance the mobility of charge carriers in a metal dichalcogenide layer to be subsequently deposited directly on the hafnium aluminum oxide layer. The thickness of the hafnium oxide, aluminum oxide or hafnium aluminum oxide layer can be, for example, in a range from 1 nm to 2 nm, although lesser and greater thicknesses can also be employed. In one embodiment, the at least one outer layer of the tunneling dielectric layer 506 can include an ONO stack, i.e., a stack of a first silicon oxide layer, a silicon nitride layer, and a second silicon oxide layer.

The optional sacrificial cover layer 508 comprises a sacrificial material that protects vertical portions of the tunneling dielectric layer 506 during subsequent processing steps. For example, the optional sacrificial cover layer 508 can comprise an amorphous or polycrystalline semiconductor material such as amorphous or polycrystalline silicon, a carbon-based material such as amorphous carbon or diamond-like carbon (DLC), or any other material that can protect the vertical portions of the tunneling dielectric layer 506 during a subsequent anisotropic etch or horizontal portions of the stack of layers (508, 506, 504, 502). The sacrificial cover layer 508 can be deposited by a conformal deposition process such as chemical vapor deposition (CVD) or atomic layer deposition (ALD). The sacrificial cover layer 508 can have a thickness in a range from 3 nm to 12 nm, although lesser and greater thicknesses can also be employed.

Referring to FIG. 3D, the optional sacrificial cover layer 508 is anisotropically etched, and physically exposed portions of the tunneling dielectric layer 506, the charge storage layer 504, and the blocking dielectric layer 502 are sequentially etched anisotropically or isotropically. In one embodiment, the optional sacrificial cover layer 508, the tunneling dielectric layer 506, the charge storage layer 504, the blocking dielectric layer 502 are sequentially anisotropically etched employing at least one anisotropic etch process. Alternatively, the optional sacrificial cover layer 508 can be removed employing an anisotropic etch, and at least one of the tunneling dielectric layer 506, the charge storage layer 504, and the blocking dielectric layer 502 can be removed employing an isotropic etch process. The horizontal portions of the optional sacrificial cover layer 508, the tunneling dielectric layer 506, the charge storage layer 504, and the blocking dielectric layer 502 located above the top surface of the insulating cap layer 70 can be removed. Further, the horizontal portions of the optional sacrificial cover layer 508, the tunneling dielectric layer 506, the charge storage layer 504, and the blocking dielectric layer 502 at a bottom of each cavity 49' can be removed to form openings in remaining portions thereof.

The remaining portion(s) of the charge storage layer 504 in the memory opening 49 include(s) a plurality of vertically spaced part charge storage elements, which can be portions of the charge storage layer 504 located at each level of the sacrificial material layers 42. The charge storage elements 504 can be a continuous layer of a charge trapping material having a generally cylindrical shape, or can be a plurality of ring-shaped charge trapping material portions located at each level of the sacrificial material layers or variants thereof. In one embodiment, the charge storage elements 504 can be a continuous layer, i.e., can be a charge storage layer. In case the charge storage elements 504 is a charge storage layer, i.e., a continuous layer of charge trapping material, each portion of the continuous layer located at each level of the sacrificial material layers 42 can be subsequently employed as a charge trapping material portion that is electrically isolated from other charge trapping material portions by regions of the continuous layer located at the levels of the insulating layers 32.

A surface of the epitaxial pedestal 11 can be physically exposed underneath the opening through the sacrificial cover portion 508, the tunneling dielectric layer 506, the charge storage elements 504, and the at least one blocking dielectric layer (501, 503). Optionally, the physically exposed portion of the epitaxial pedestal 11 can be vertically recessed. A tunneling dielectric layer 506 is located on, and surrounded by, the charge storage elements 504. The charge storage elements 504 can comprise a charge trapping material or a floating gate material. Optionally, the tunneling dielectric layer 506, the charge storage elements 504, and the blocking dielectric layer 502 can be laterally recessed with respect to an inner sidewall of the sacrificial cover portion 508. A set of adjoining material portions including a blocking dielectric layer 502, charge storage elements 504, and a tunneling dielectric layer 506 within a memory opening 49 constitutes a memory film 50.

Referring to FIG. 3E, the sacrificial cover portion 508 can be removed, for example, by an isotropic etch. If the sacrificial cover portion 508 comprises a semiconductor material, a wet etch process can be employed to remove the sacrificial cover portion 508. In this case, a surface portion of the epitaxial pedestal 11 may be collaterally etched. If the sacrificial cover portion 508 comprises a carbon-based material, the sacrificial cover portion 508 can be removed, for example, by ashing. A suitable clean process may be optionally performed afterwards. If desired, the exposed surface of the tunneling dielectric layer 506 may be cleaned, such as by an anneal in a hydrogen atmosphere at 700 to 750° C.

Referring to FIG. 3F, a metal dichalcogenide channel layer 60L is deposited on the physically exposed surfaces of the epitaxial pedestal 11, the memory film 50, and the insulating cap layer 70. In one embodiment, the tunneling dielectric layer 506 within the memory film 50 can include a hafnium oxide, aluminum oxide or hafnium aluminum oxide layer as an innermost layer, and the metal dichalcogenide channel layer 60L can be formed directly on the hafnium oxide, aluminum oxide or hafnium aluminum oxide layer.

In one embodiment, the metal dichalcogenide in the metal dichalcogenide layer 60L can include a transition metal dichalcogenide, i.e., a dichalcogenide of a transition metal, having a formula $MA_2$, where M is transition metal and A is chalcogen. For example, the transition metal dichalcogenide can comprise $Mo_{1-x}W_xS_{2-y-z}Se_yTe_z$, in which x is a number in a range from, and including, 0 to, and including 1, y is a number in a range from, and including, 0 and to, and including, 2, and z is a number in a range from, and including, 0 and to, and including, 2. In an embodiment, the transition metal dichalcogenide can comprise $Mo_{1-x}W_xS_{2-y-z}Se_y$, in which x is a number in a range from, and including, 0 to, and including 1, and y is a number in a range from, and including, 0 and to, and including, 2. Thus, the transition metal dichalcogenide can comprise $MoS_2$, $WS_2$, $MoSe_2$, $WSe_2$, or an alloy thereof (e.g., $Mo_{1-x}W_xS_2$, $Mo_{1-x}W_xSe_2$, $MoS_{2-y-z}Se_y$, $W_xS_{2-y-z}Se_y$, or $Mo_{1-x}W_xS_{2-y-z}Se_y$). In one embodiment, the metal dichalcogenide layer 60L can have a substantially uniform thickness, which may be in a range from 1 monolayer to 8 monolayers of $Mo_{1-x}W_xS_{2-y}Se_y$. In another embodiment, more than 8 monolayers of $Mo_{1-x}W_xS_{2-y}Se_y$ may be employed. In one embodiment, the metal dichalcogenide layer 60L can have a uniform thickness in a range from 1 monolayer to 5 monolayers of $Mo_{1-x}W_xS_{2-y}Se_y$. In one embodiment, the metal dichalcogenide layer 60L can have a uniform thickness in a range from 1 monolayer to 3 monolayers of $Mo_{1-x}W_x S_{2-y}Se_y$ (e.g., a 0.65 to 3 nm thick layer of $MoS_2$). In such thickness ranges, the metal dichalcogenide layer 60L can provide a two-dimensional electron gas with quantum confinement along a radial direction of the memory opening, i.e., with quantum confinement in the direction of the thickness of the metal dichalcogenide layer 60L. In case an epitaxial channel portion 11 that is epitaxially aligned to the semiconductor material layer 10 is formed at a lower end of the memory opening, the metal dichalcogenide channel 60L can be formed directly on a top surface of the epitaxial channel portion.

The metal dichalcogenide channel layer 60L preferably includes one or more molecular monolayers of transition metal dichalcogenide, such as 1-3 molecular monolayers of molybdenum disulfide ($MoS_2$). Thus, the single or a few monolayer material exhibits quantum confinement and is not a bulk material. The monolayer material, such as molybdenum disulfide has a wider, direct band gap (e.g., about 1.8 eV), a higher electron mobility (e.g., at least 200 $cm^2/Vs$) and sharper threshold slope (e.g., about 80 mV/sec) than polysilicon or bulk molybdenum disulfide. A single molecular monolayer of transition metal dichalcogenide (e.g., $Mo_{1-x}W_xS_{2-y}Se_y$, such as $MoS_2$, for example), contains a sheet, i.e., an atomic monolayer, of transition metal atoms (e.g., Mo) sandwiched between two sheets, i.e., atomic monolayers, of chalcogen atoms (e.g., sulfur). The transition metal atoms and chalcogen atoms in each molecular monolayer are bound to each other by strong covalent bonds. The strong intra molecular monolayer covalent bonds in transition metal dichalcogenide crystals provide excellent mechanical strength, thermal stability (e.g., up to 1000° C. or more for $MoS_2$ in inert environment), and a surface free of dangling bonds. On the other hand, the adjacent molecular monolayers are bound to each other by weak inter-monolayer van der Waal's force. In other words, the intra molecular monolayer metal-chalcogenide (e.g., Mo—S) bonds are strong and of covalent type, while the interaction between molecular monolayers in multilayer metal dichalcogenide (e.g., $MoS_2$) is weak and of the Van der Waals type. The weaker inter molecular monolayer van der Waal's force allows single layer or few-layer transition metal dichalcogenide thin films to be created by, for example, anisotropic two dimensional growth by CVD or ALD. This property of transition metal dichalcogenide thin films (and two dimensional materials in general), enables creation of atomically smooth two dimensional material sheets (e.g., molecular monolayers), and a precise control of a number of molecular monolayers in the thin film. Field effect transistors containing channels having ultra thin, few-layer two dimensional crystals, hence, are effectively an optimal form of ultra thin body field effect transistors, e.g., a transistor structure ideal for suppressing the short-channel effects at its scaling limit. The three dimensional NAND device of embodiments of the present disclosure includes memory cell transistors (e.g., NAND strings) with the above described channel.

The metal dichalcogenide channel layer 60L can be deposited by a conformal atomic layer deposition ("ALD") process, such as plasma enhanced ALD ("PEALD"). In one embodiment, the metal dichalcogenide channel layer may be deposited by a two step ALD process. In a first step, a transition metal oxide is formed by ALD by forming alternating monolayers of metal and oxygen. Optionally, the tunneling dielectric surface is precleaned by a hydrogen atmosphere anneal at 700 to 750 C before metal oxide layer deposition. In a second step, the metal oxide is converted to metal dichalcogenide by annealing the layer in a chalcogen containing ambient. For example, $Mo_{1-x}W_xO_y$ (where x ranges between zero and one) can be formed by cycles of ALD on the tunneling dielectric layer 506. Then, in a second step, the metal oxide is converted to a metal disulfide by sulfurization step. For example, organic contaminants may be removed by annealing the metal oxide layer at about 200 C for 20 to 60 minutes in hydrogen and argon (e.g., at 25 sccm flow rate each). Then, the temperature is ramped up to 600 to 850 C at a rate of 10 to 20 C/min, followed by sulfurization at about 850 to 900 C for 20 min to 30 minutes in an argon and $H_2S$ atmosphere (e.g., at a flow rate of Ar 50 sccm & $H_2S$ 5 sccm). Optionally, in a second sulfurization step, the temperature is ramped up further to 950 to 1050 C using a rapid thermal processing anneal (e.g., for less than 1 minute). The temperature is then ramped down to room temperature in argon atmosphere.

Referring to FIG. 3G, an interfacial dielectric layer 522 can be optionally formed on the inner sidewall of the metal dichalcogenide layer 60L. The interfacial dielectric layer 522 includes a dielectric material that reduces the trap density of the metal dichalcogenide layer 60L at the interface with the interfacial dielectric layer 522, thereby improving the charge carrier mobility in the metal dichalcogenide layer 60L. In one embodiment, the interfacial dielectric layer 522 comprises a high dielectric constant (high-k) dielectric material. In one embodiment, the interfacial dielectric layer 522 comprises hafnium oxide, aluminum oxide or hafnium aluminum oxide ($Hf_{3y}Al_{4-4y}O_{6+\in}$; $0<y<1$, and $-1<\in<1$). The thickness of the interfacial dielectric layer 522 can be in a range from 1 nm to 2 nm, although lesser and greater thicknesses can also be employed.

Referring to FIG. 3H, a dielectric core 62 is formed within each cavity 49' that is laterally surrounded by the interfacial dielectric layer 522. For example, a dielectric material such as silicon oxide or organosilicate glass can be deposited in each cavity 49' by a conformal deposition method such as low pressure chemical vapor deposition (LPCVD), or by a self-planarizing deposition process such as spin coating.

The horizontal portions of the dielectric material, the optional interfacial dielectric layer 522 (if present), and the metal dichalcogenide layer 60L can be removed from above the top surface of the insulating cap layer 70 by a planarization process. The planarization process can employ, for example, by a recess etch or chemical mechanical planarization. Each remaining portion of the metal dichalcogenide layer 60L constitutes a metal dichalcogenide channel 60 extending through a memory opening and located inside a memory film 50. Each remaining portion of the dielectric material constitutes a dielectric core 62 located inside a metal dichalcogenide channel 60 and the optional interfacial dielectric layer 522.

Referring to FIG. 3I, the top surface of the remaining portion of the dielectric core 62 and the optional interfacial dielectric layer 522 can be recessed to form a recess region within each memory opening 49, for example, by a recess etch to a depth that is located between the top surface of the insulating cap layer 70 and the bottom surface of the insulating cap layer 70. The top surface of the dielectric core 62 is located between a first horizontal plane including the top surface of the insulating cap layer 70 and a second horizontal plane including the bottom surface of the insulating cap layer 70.

Referring to FIG. 3J, a doped semiconductor drain portion 630 can be formed by depositing a doped semiconductor material within the recessed region above the dielectric cores 62. The doped semiconductor drain portion 630 is a drain region including a doped semiconductor material. The doped semiconductor material can be, for example, doped polysilicon or amorphous silicon or a doped compound semiconductor material. In one embodiment, the atomic concentration of the dopants of the second conductivity type in the doped semiconductor material can be in a range from $1.0 \times 10^{19}/cm^3$ to $2.0 \times 10^{21}/cm^3$, although lesser and greater atomic concentrations can also be employed. The dopants may be introduced in-situ during growth and/or ex-situ after growth by ion implantation (e.g., arsenic or phosphorus n-type dopants).

Excess portions of the deposited semiconductor material can be removed from above the top surface of the insulating cap layer 70, for example, by chemical mechanical planarization (CMP) or a recess etch to form the doped semiconductor drain portion 630 that is surrounded by the metal dichalcogenide channel 60. In one embodiment, a top surface of the doped semiconductor drain portion 630 can be coplanar with the top surface of the insulating cap layer 70. In one embodiment, the top surfaces of the doped semiconductor drain portion 630, the optional interfacial dielectric layer 522, the metal dichalcogenide channel 60, and the memory film 50 can be coplanar with the top surface of the insulating cap layer 70. The doped semiconductor drain portion 630 including a doped semiconductor material portion can be formed directly on a sidewall of the metal dichalcogenide channel 60. The doped semiconductor drain portion 630 may be activated by rapid thermal anneal at about 900 C.

Due to the two-dimensional nature, or a pseudo-two-dimensional nature, of the metal dichalcogenide channel 60, a two-dimensional electron gas can be formed in the metal dichalcogenide channel 60. The two-dimensional electron gas can be a cylindrical confinement electron gas. As used herein, "cylindrical confinement" refers to a two-dimensional confinement in which a global topology of the two-dimensional space is homeomorphic to a sidewall surface of a cylinder. As used herein, "cylindrical confinement electron gas" refers to electron gas in cylindrical confinement. Quantum confinement (e.g., quantization) of electrons occurs in the channel. Electron current can flow vertically with high mobility in the cylindrical confinement electron gas.

Figure 3K:
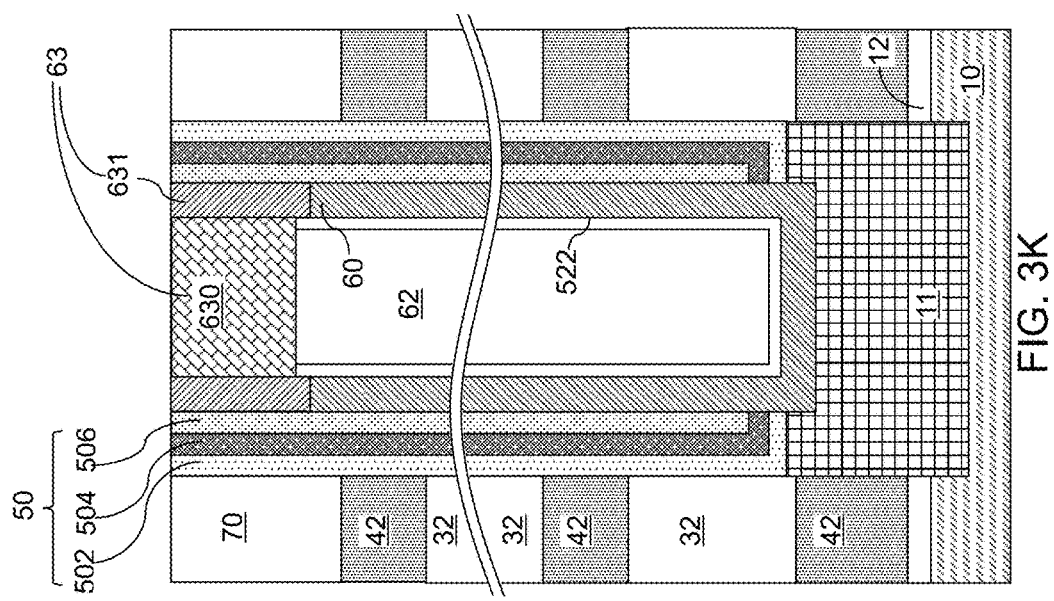
FIG. 3K is an alternative embodiment of the first exemplary stack structure according to the first embodiment of the present disclosure.

Referring to FIG. 3K, an alternative embodiment of the first exemplary stack structure is illustrated. The alternate embodiment of the first exemplary stack structure can be derived from the structure of FIG. 3I or the structure of FIG. 3J by implanting electrical dopants (such as n-type dopants) into an upper portion of the metal dichalcogenide channel 60. The implanted upper portion of the metal dichalcogenide channel 60 is converted into a doped annular metal dichalcogenide portion, which is herein referred to as an annular doped metal dichalcogenide drain portion 631. Each drain region 63 can include a set of an annular doped metal dichalcogenide drain portion 631 and a doped semiconductor drain portion 630. In one embodiment, the ion implantation can be performed after the processing steps of FIG. 3I and before the processing steps of FIG. 3J. In another embodiment, the ion implantation can be performed after the processing steps of FIG. 3J. In this case, the doped semiconductor drain portion 630 can be formed directly on an inner sidewall of the annular doped metal dichalcogenide drain portion 631 as another component of the drain region 63.

Figure 4A:
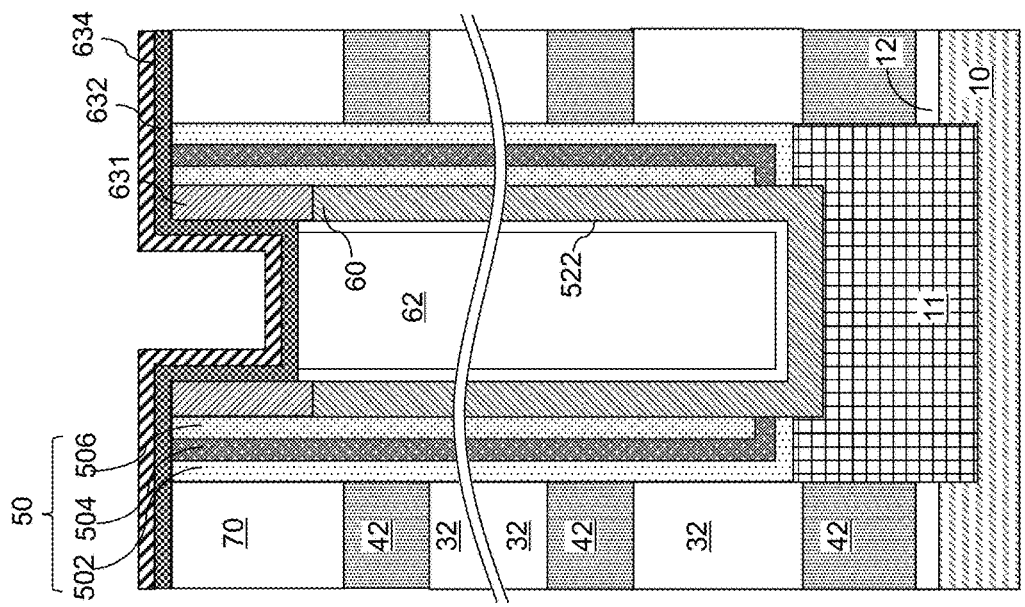
Figure 4B:
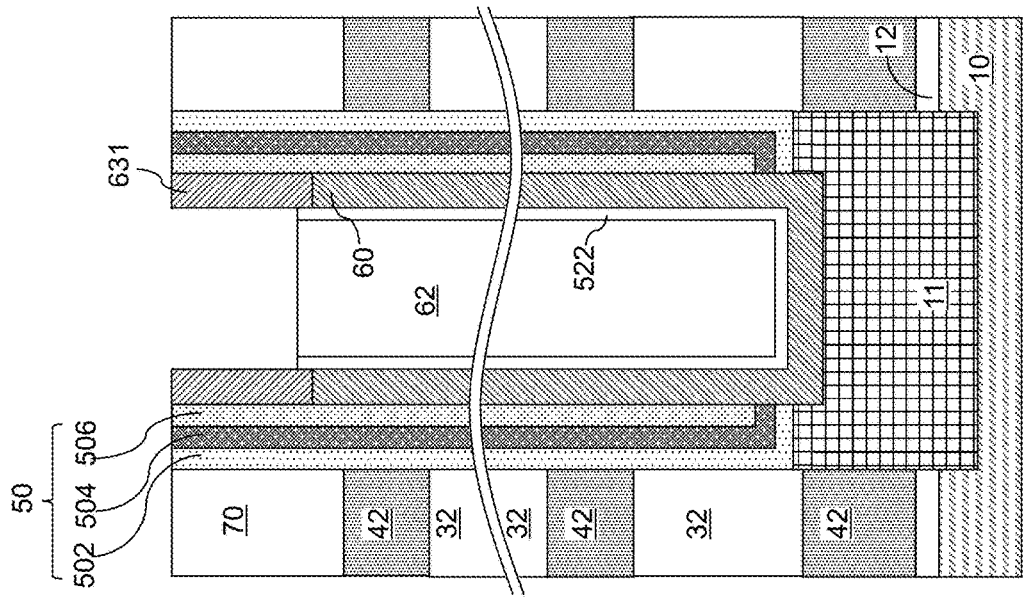

FIGS. 4A-4C illustrate a process of forming a second exemplary memory stack structure. Referring to FIG. 4A, the second exemplary memory structure can be derived from the first exemplary memory stack structure of FIG. 3I by forming an annular doped metal dichalcogenide drain portion 631. The annular doped metal dichalcogenide drain portion 631 can be formed, for example, by implanting electrical dopants into an upper portion of the metal dichalcogenide channel 60 employing an ion implantation process (e.g., an angled ion implantation process with rotation), a solid state diffusion or a plasma doping process. For example, potassium is known to act as an n-type dopant in transition metal dichalcogenide semiconductor materials. Other relevant dopants can be used. An upper portion of the metal dichalcogenide channel 60 is converted into the annular doped metal dichalcogenide drain portion 631. Thus, the annular doped metal dichalcogenide drain portion 631 contacts an upper end of the remaining portion of the metal dichalcogenide channel 60. The annular doped metal dichalcogenide drain portion 631 is a component of a drain region.

Referring to FIG. 4B, at least one metal layer (632, 634) can be deposited on the annular doped metal dichalcogenide drain portion 631. The at least one metal layer (632, 634) can be a single metal layer, or can be a stack or an alloy of at least two metal layers. Each of the at least one metal layer (632, 634) can include a metal or metal alloy that forms an Ohmic contact with the doped metal dichalcogenide drain portion 631. In one embodiment, each of the at least one metal layer (632, 634) can be selected from Ti, Au, Ni, In and alloys thereof. For example, a stack of a first metal layer 632 and a second metal layer 634 can be deposited directly on the annular doped metal dichalcogenide drain portion 631. In one embodiment, the first metal layer 632 can consist essentially of titanium, and can have a thickness in a range from 1 nm to 10 nm, although lesser and greater thicknesses can also be employed. In one embodiment, the second metal layer 634 can consist essentially of gold, and can have a thickness in a range from 1 nm to 10 nm, although lesser and greater thicknesses can also be employed. The layers 632 and 634 may be annealed (e.g., in argon and hydrogen at about 400° C. to 650° C. for 10-120 minutes, such as at about 550° C. for 60 minutes to reduce resistance and to create a clean surface. A recessed region can be present over the dielectric core 62 and within sidewalls of the stack of the first metal layer 632 and the second metal layer 634.

In one embodiment, the at least one metal layer (632, 634) can include a layer stack including a titanium layer and a nickel layer. In one embodiment, the at least one metal layer (632, 634) can include a layer stack including a titanium layer, a nickel layer, and a gold layer. In one embodiment, a metal silicide (such as nickel silicide) can be formed in lieu of, or prior to formation of, the at least one metal layer (632, 634). In this case, the at least one metal layer (632, 634) can be modified to be replaced with, or to additionally include, a nickel silicide layer. In one embodiment, the at least one metal layer (632, 634) can include an alloy layer including a material selected from a titanium-gold alloy, a nickel-gold alloy, and a titanium-nickel-gold alloy.

Referring to FIG. 4C, a doped semiconductor material can be deposited within the recessed region. The doped semiconductor material can be deposited employing the same method as the deposition method employed at the processing step of FIG. 3J to form the doped semiconductor drain portion 630. In one embodiment, the atomic concentration of the dopants of the second conductivity type in the doped semiconductor material can be in a range from $1.0 \times 10^{19}/cm^3$ to $2.0 \times 10^{21}/cm^3$, although lesser and greater atomic concentrations can also be employed. The dopants may be introduced in-situ during growth and/or ex-situ after growth by ion implantation.

Portions of the doped semiconductor material, the second metal layer 634, and the first metal layer 632 located above the horizontal plane including the top surface of the insulating cap layer 70 can be removed by a planarization process, which can include at least one recess etch and/or chemical mechanical planarization. Each remaining portion of the doped semiconductor material is a doped semiconductor drain portion 630. Each remaining portion of the second metal layer 634 can include a cylindrical portion and a horizontal bottom portion. Each remaining portion of the first metal layer 632 can include a cylindrical portion and a horizontal bottom portion. Each drain region 63 can include an annular doped metal dichalcogenide drain portion 631, a first metal layer 632 contacting the annular doped metal dichalcogenide drain portion 631, a second metal layer 634 contacting the first metal layer 632, and a doped semiconductor drain portion 630 that is laterally surrounded by, the stack of the first metal layer 632 and the second metal layer 634. Thus, the drain doped semiconductor drain portion 630 is formed within a cavity laterally surrounded by the stack of the first metal layer 632 and the second metal layer 634.

Referring to FIG. 4D, an alternative embodiment of the second exemplary stack structure can be derived from the second exemplary stack structure by omitting formation of the annular doped metal dichalcogenide drain portion 631. In this case, the first metal layer 632 can be formed directly on the sidewall of the metal dichalcogenide channel 60. The doped semiconductor drain portion 630 can be formed by in-situ doping of the deposited semiconductor material.

Figure 5A:
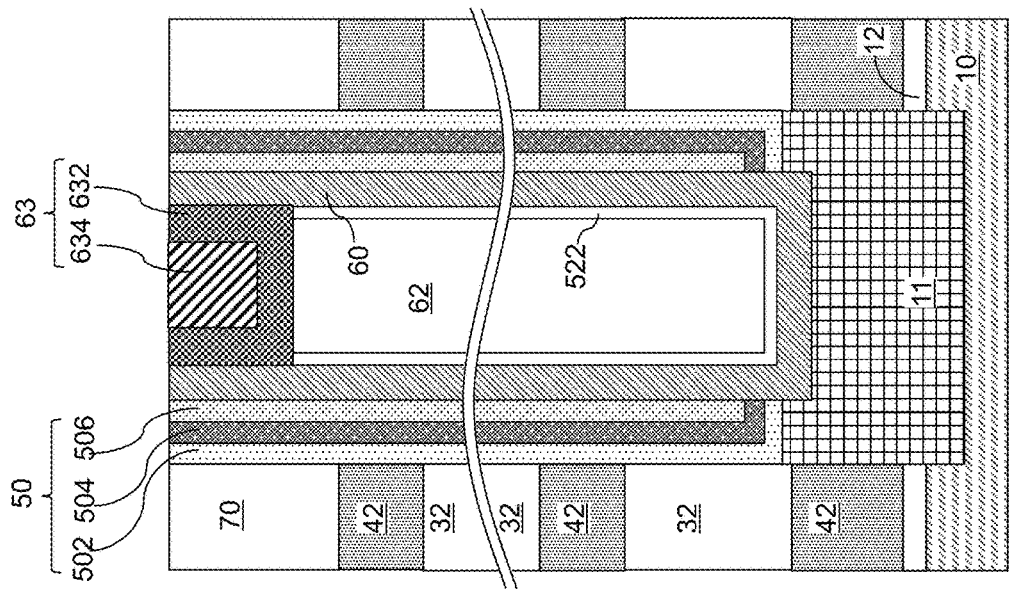
FIG. 5A is a vertical cross-sectional view of a memory opening including a third exemplary memory stack structure according to a third embodiment of the present disclosure.

Referring to FIG. 5A, a memory opening including a third exemplary memory stack structure is illustrated. The third exemplary memory stack structure can be derived from the second exemplary memory stack structure of FIG. 4B by selecting the thicknesses of the first metal layer 632 and the second metal layer 634 such that the entire cavity above the dielectric core 62 is filled with the stack of the first metal layer 632 and the second metal layer 634, and by removing portions of the stack of the first metal layer 632 and the second metal layer 634 from above a horizontal plane including the top surface of the insulating cap layer 70 employing a planarization process. In this case, each drain region 63 can include an annular doped metal dichalcogenide drain portion 631, a first metal layer 632, and a second metal layer 634.

Figure 5B:
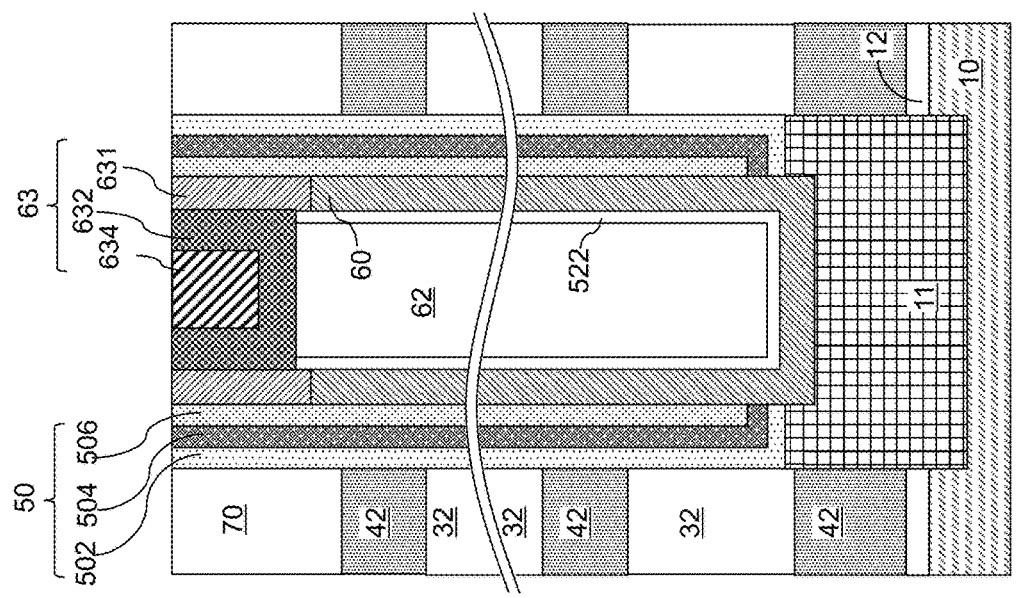
FIG. 5B is a vertical cross-sectional view of a memory opening including an alternate embodiment of the third exemplary memory stack structure according to the third embodiment of the present disclosure.

Referring to FIG. 5B, an alternate embodiment of the third exemplary memory stack structure is illustrated, which can be derived from the third exemplary memory stack structure of FIG. 5B by omitting formation of the annular doped metal dichalcogenide drain portion 631. In this case, the first metal layer 632 can be formed directly on the sidewall of the metal dichalcogenide channel 60. The doped semiconductor drain portion 630 can be formed by in-situ doping of the deposited semiconductor material. In alternative embodiment, the drain region 63 may comprise a metal silicide, such as titanium, tungsten or nickel silicide instead of or in addition to the drain materials described above.

Figure 6:
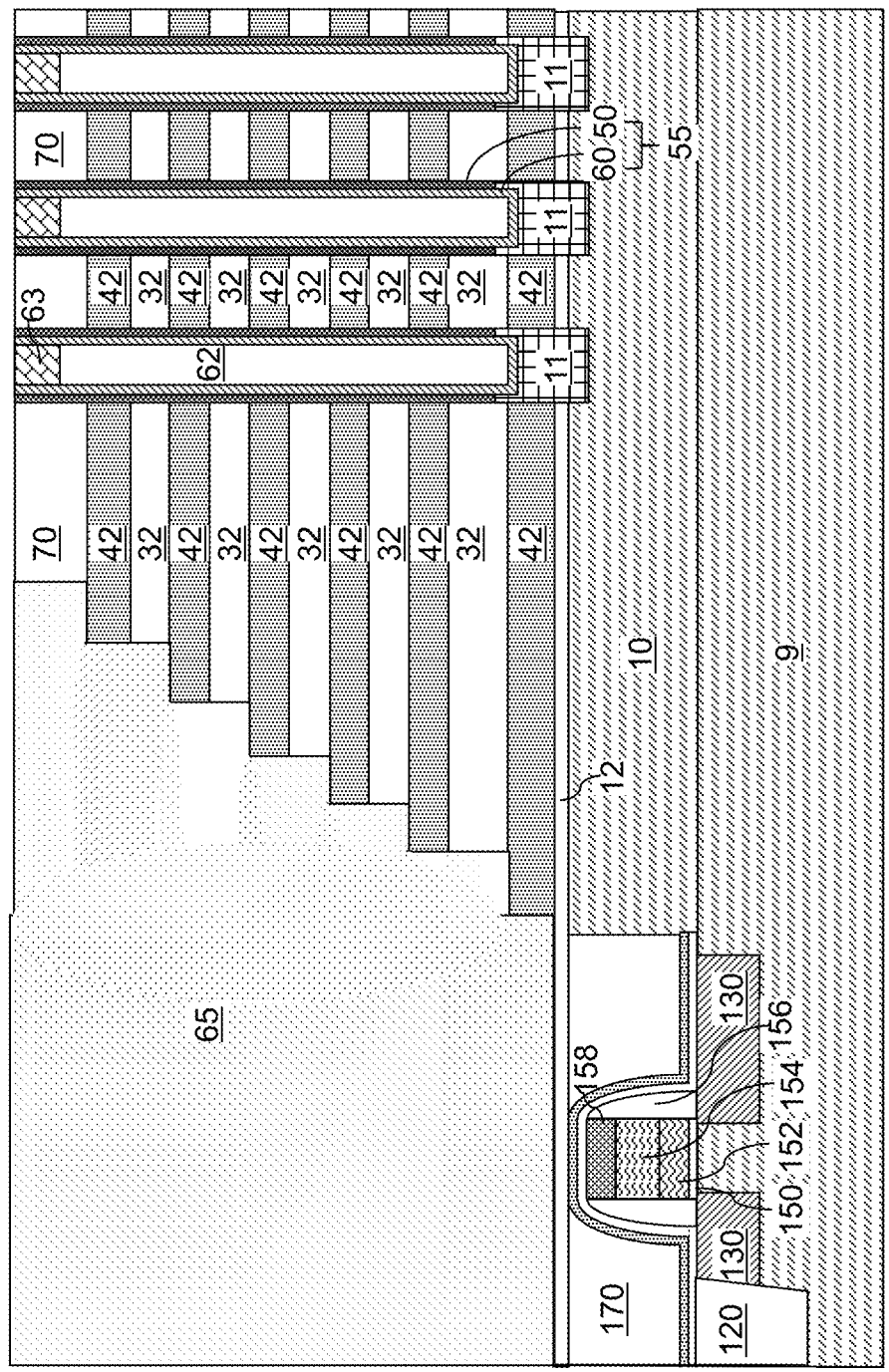
FIG. 6 is a vertical cross-sectional view of the exemplary device structure after formation of memory stack structures according to an embodiment of the present disclosure.

Multiple instances of any of the exemplary memory stack structures described above can be embedded into the exemplary device structure illustrated in FIG. 2. FIG. 6 illustrates the exemplary device structure that incorporates multiple instances of an exemplary memory stack structure, which can be any of the exemplary memory stack structures of FIGS. 3J, 3K, 4C, 4D, 5A, and 5B. The exemplary device structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a blocking dielectric layer 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. A metal dichalcogenide channel 60 and a memory film 50 in a same memory opening 49 constitute a memory stack structure 55.

Figure 7A:
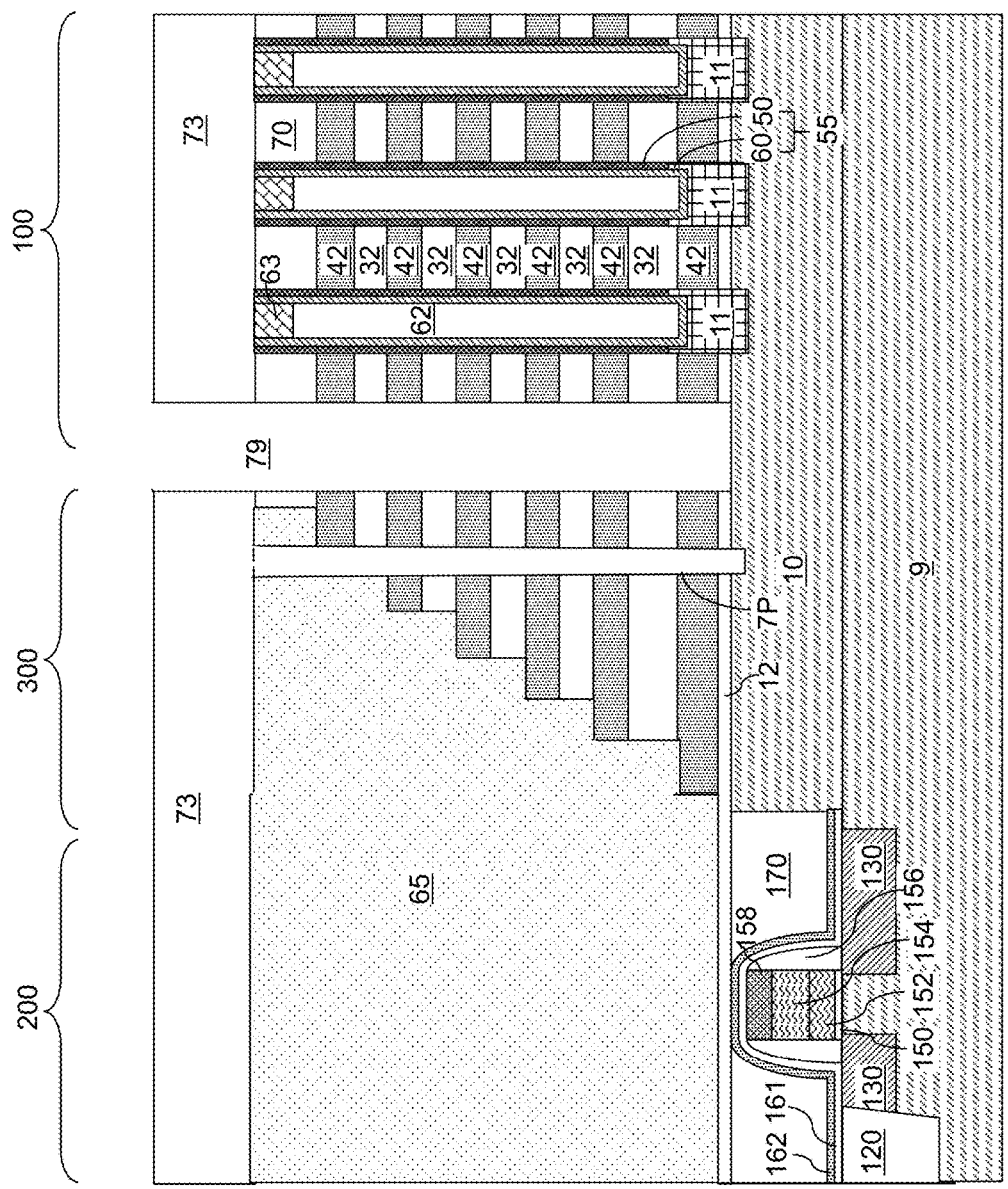
FIG. 7A is a vertical cross-sectional view of the exemplary device structure after formation of a backside contact trench according to an embodiment of the present disclosure.
Figure 7B:
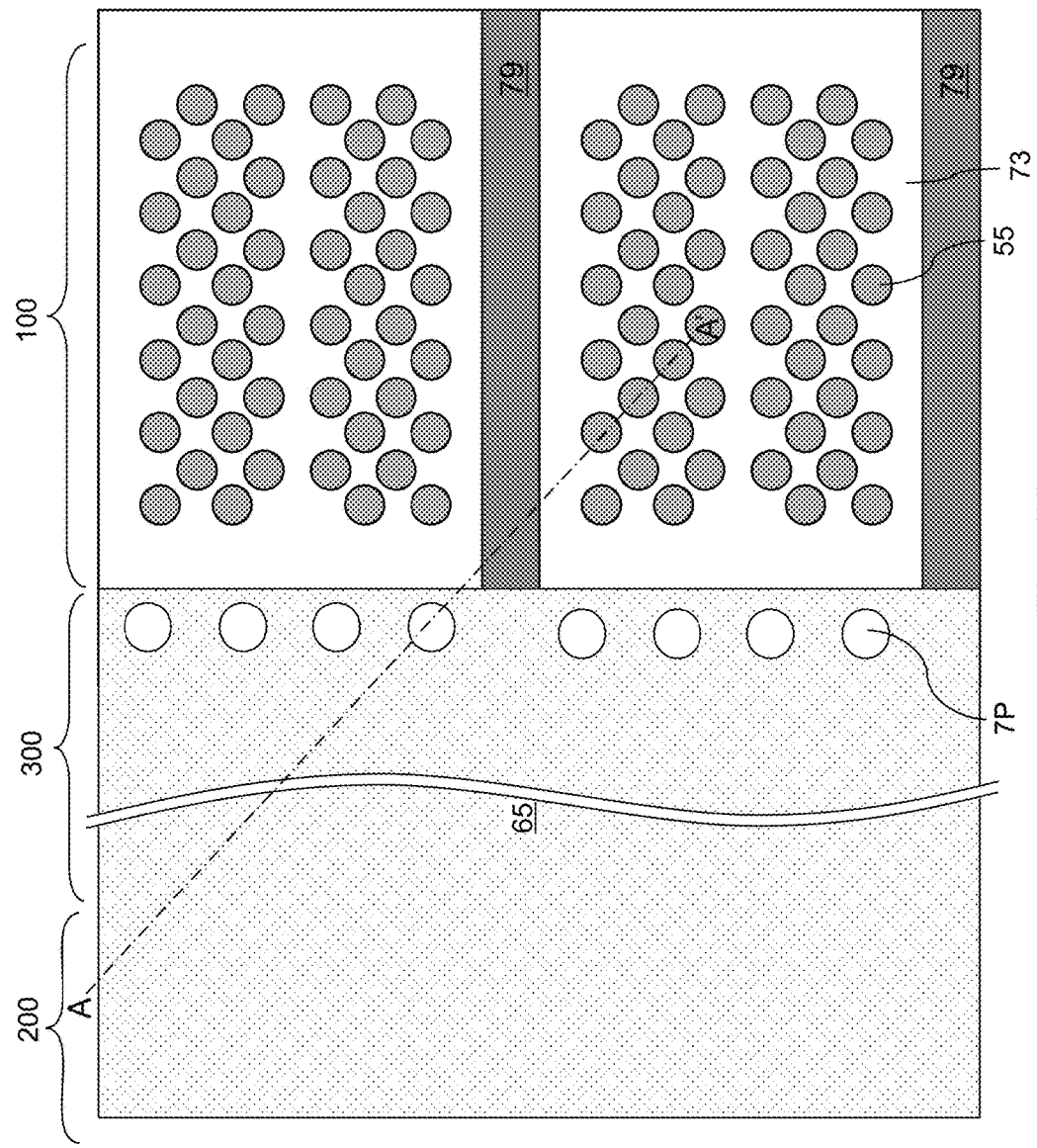
FIG. 7B is a partial see-through top-down view of the exemplary device structure of FIG. 7A. The vertical plane A-A' is the plane of the vertical cross-sectional view of FIG. 7A.

Referring to FIGS. 7A and 7B, at least one dielectric support pillar 7P may be optionally formed through the retro-stepped dielectric material portion 65 and/or through the insulating cap layer 70 and/or through the alternating stack (32, 42). The plane A-A' in FIG. 7B corresponds to the plane of the vertical cross-sectional view of FIG. 7A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated openings in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Figure 8:
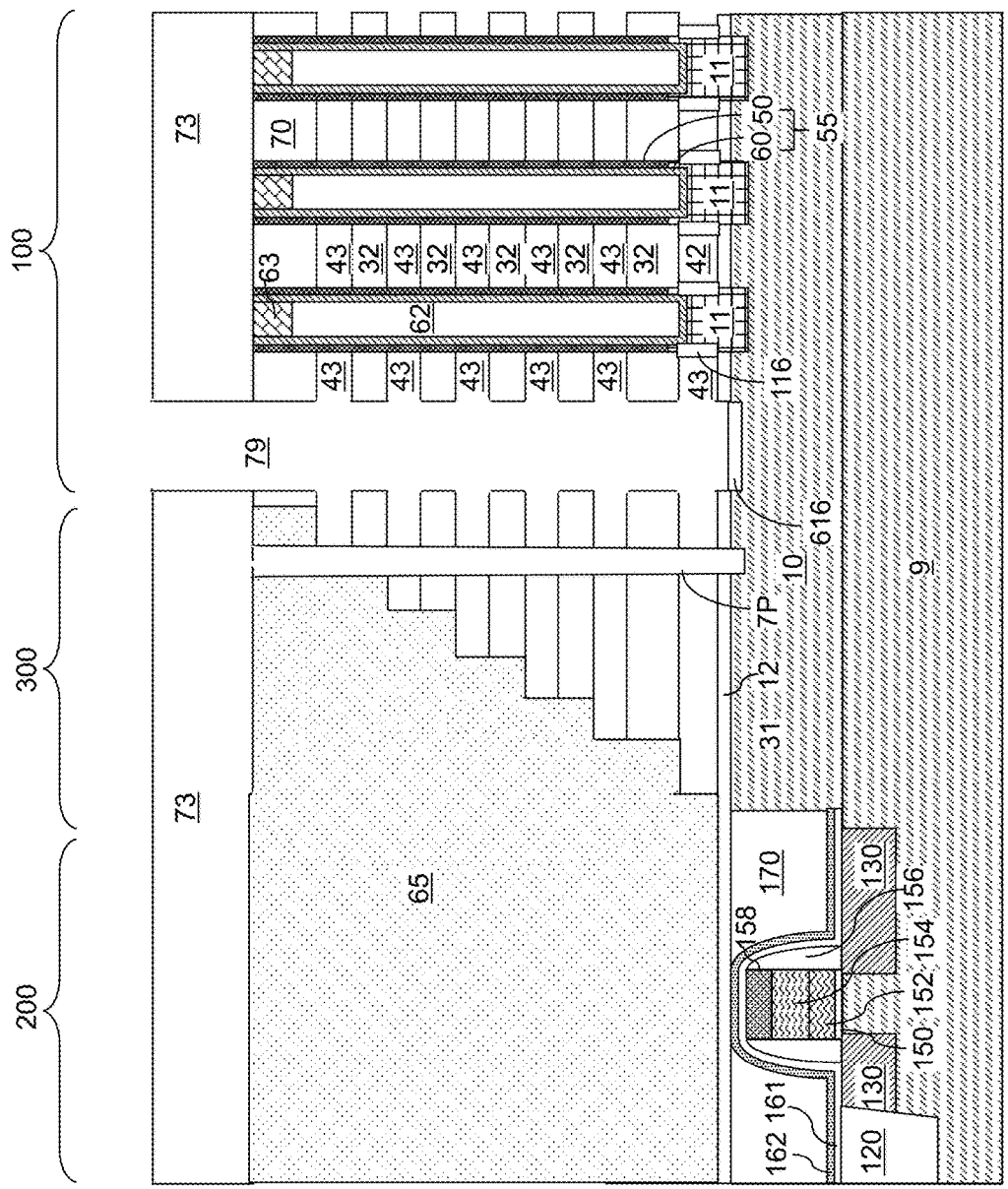
FIG. 8 is a vertical cross-sectional view of the exemplary device structure after formation of backside recesses according to the embodiment of the present disclosure.

Referring to FIG. 8, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the memory device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 9:
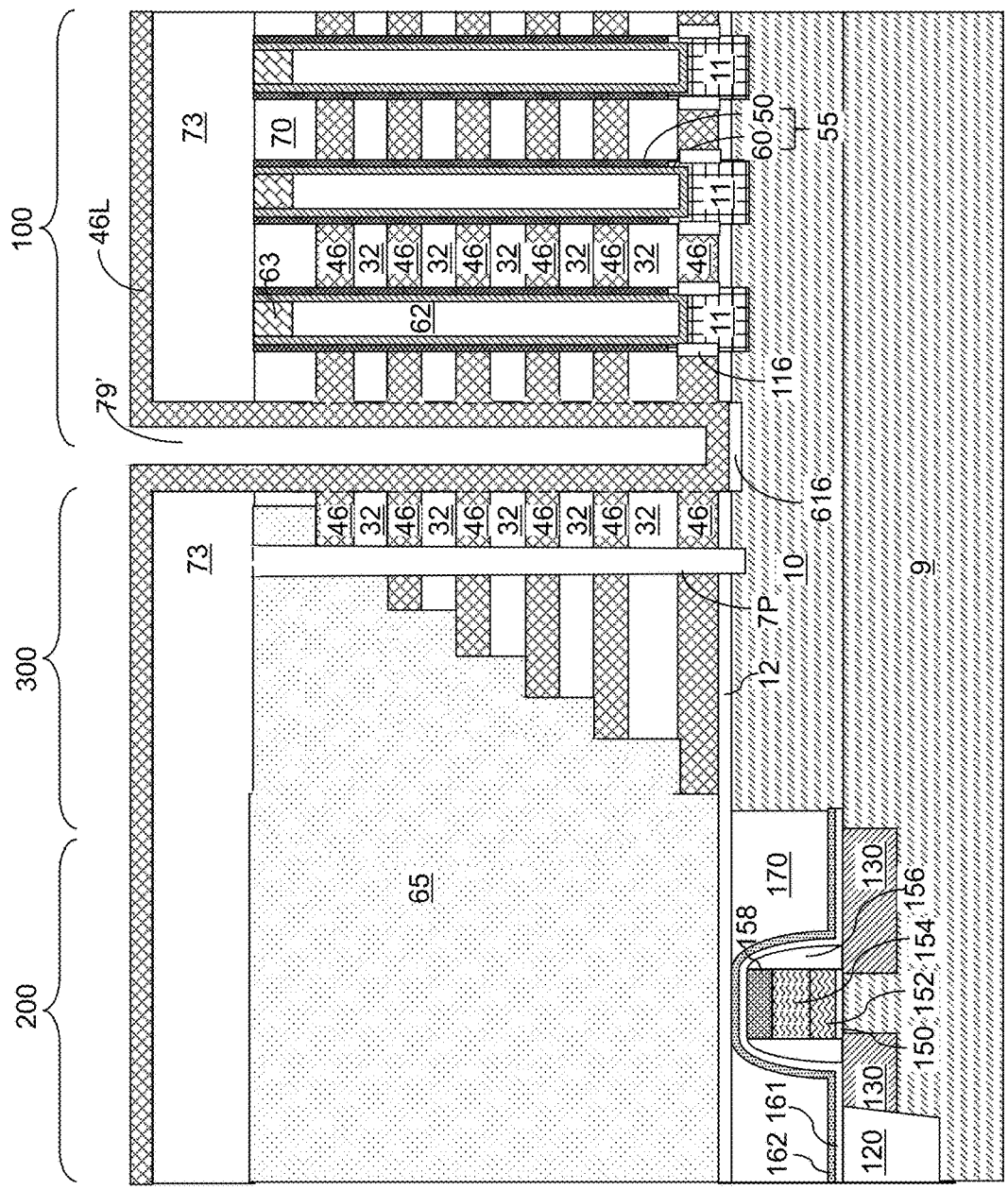
FIG. 9 is a vertical cross-sectional view of the exemplary device structure after formation of electrically conductive layers according to an embodiment of the present disclosure.

Referring to FIG. 9, a backside blocking dielectric layer (not shown) can be optionally formed. The backside blocking dielectric layer comprises a dielectric material that functions as a control gate dielectric for the control gates to be subsequently formed in the backside recesses 43. In case the blocking dielectric layer 502 is present within each memory opening, the backside blocking dielectric layer is optional. In case the blocking dielectric layer 502 is omitted, the backside blocking dielectric layer is present.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of the sacrificial dielectric portion 616. A backside cavity 79' is present within the portion of each backside via trench 79 that is not filled with the backside blocking dielectric layer.

At least one metallic material can be deposited in the plurality of backside recesses 43, on the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A dielectric spacer 116 laterally surrounds a semiconductor portion that underlies the lower doped semiconductor portion, wherein one of the electrically conductive layers laterally surrounds the dielectric spacer upon formation of the electrically conductive layers.

Figure 10:
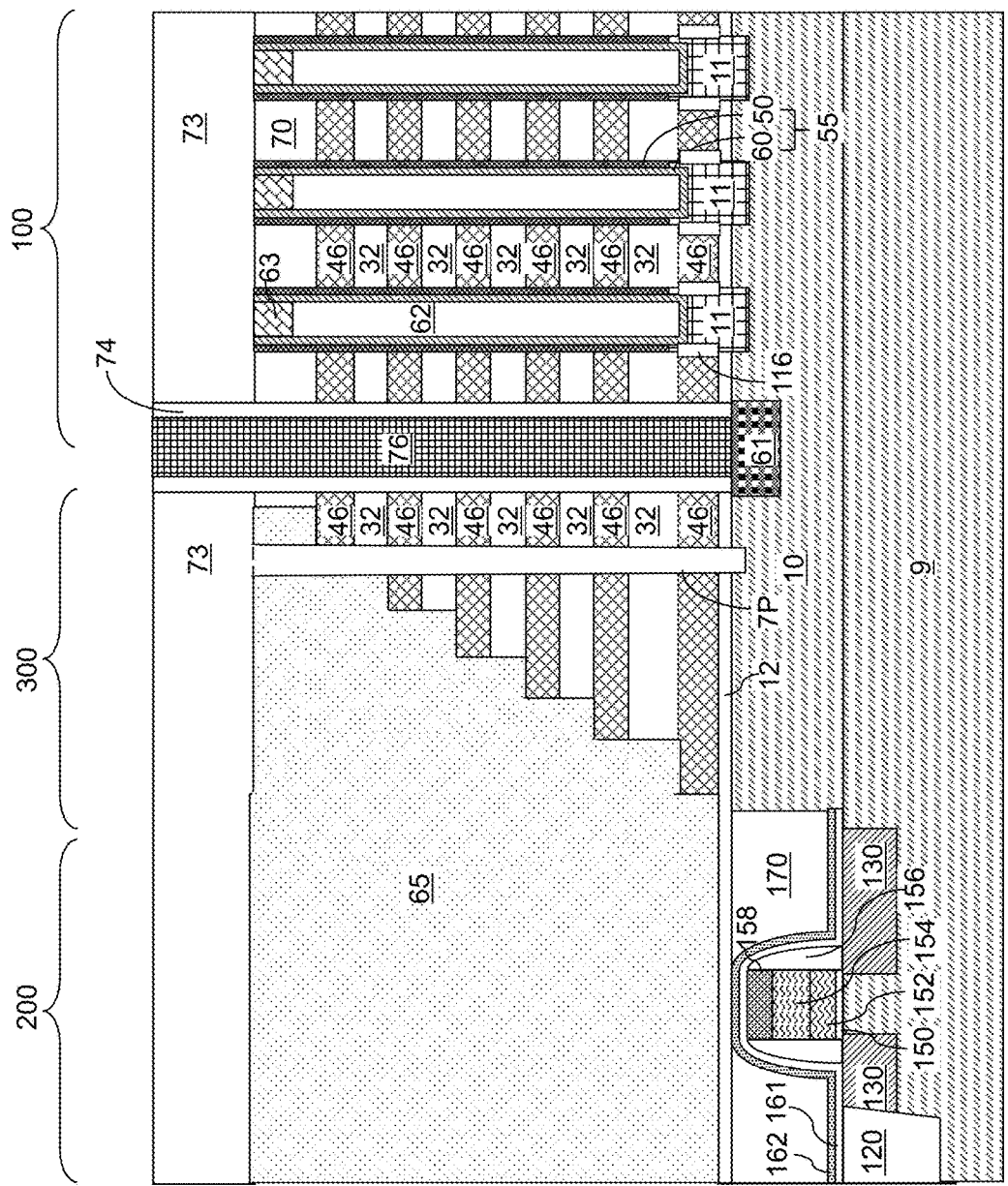
FIG. 10 is a vertical cross-sectional view of the exemplary device structure after formation of backside contact via structures according to an embodiment of the present disclosure.

Referring to FIG. 10, the deposited metallic materials of the continuous electrically conductive material layer 46L is etched back from the sidewalls of each backside contact trench 79 and from above the contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. A source region 61 can be formed at the bottom of each backside contact trench 79 by implantation of electrical dopants into surface portions of the semiconductor material layer 10 that underlie the backside contact trenches 79.

An insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

An anisotropic etch is performed to remove horizontal portions of the insulating material layer and to remove the horizontal portion of the backside blocking dielectric layer from above the contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61, while a center portion of the top surface of the source region 61 is physically exposed.

Each insulating spacer 74 can be formed over the sidewalls of the backside contact trench 79, and can be formed directly on substantially vertical sidewalls of the backside blocking dielectric layer and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm.

A backside contact via structure 76 can be formed in the cavity surrounded by the insulating spacer 74. The backside contact via structure 76 includes a conductive material, which can include, for example, a conductive liner (such as a Ti barrier layer and a TiN barrier layer) and a conductive fill material such as tungsten. The backside contact via structure 76 can function as a source electrode or local interconnect that contacts the source region 61.

Figure 11:
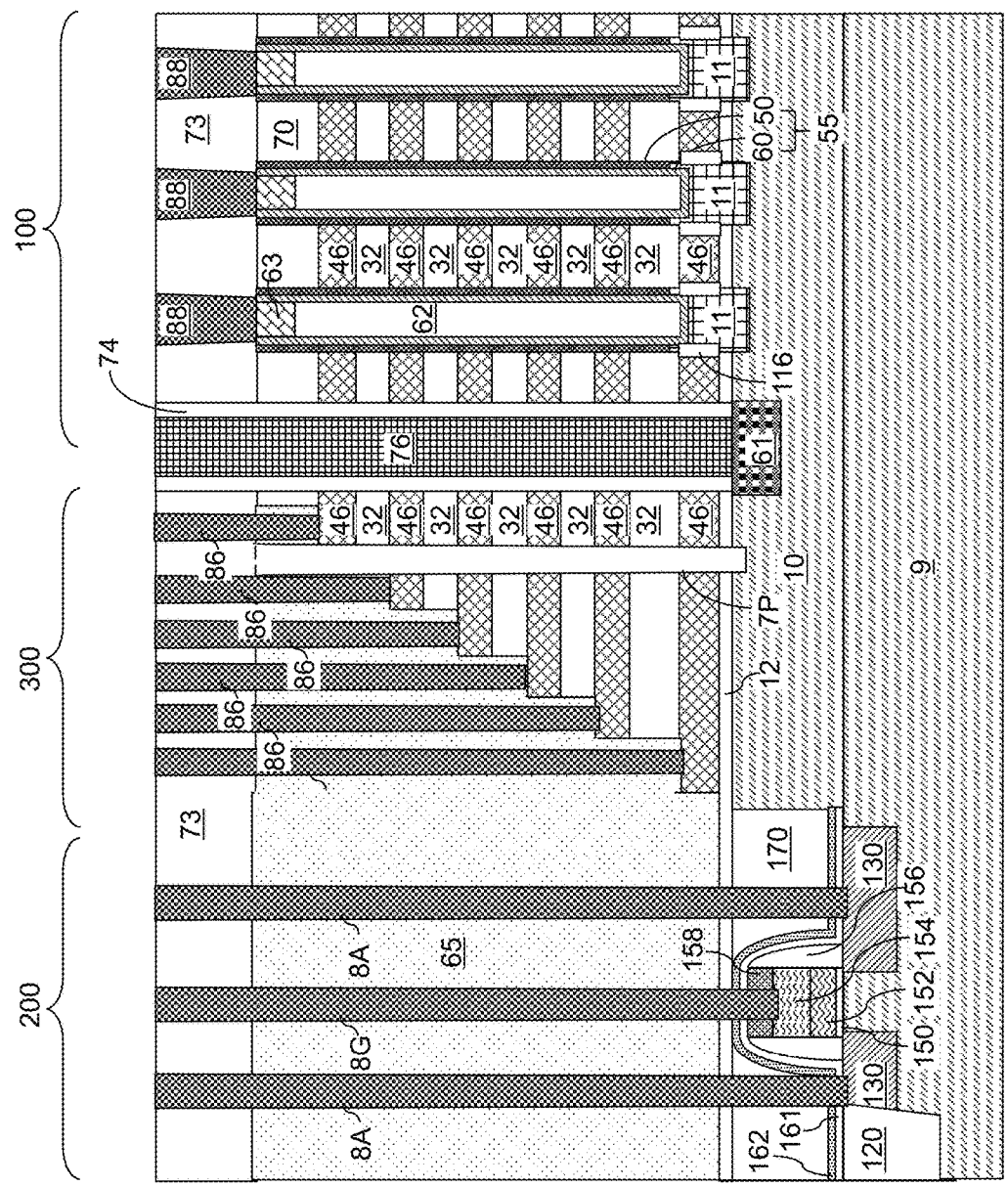
FIG. 11 is a vertical cross-sectional view of the exemplary device structure after formation of additional contact via structures according to an embodiment of the present disclosure.

Referring to FIG. 11, various additional contact via structures (88, 86, 8G, 8A) can be formed through dielectric material layers/portions of the exemplary structure. For example, memory contact via structures 88 can be formed through the contact level dielectric layer 73. In this case, a photoresist layer (not shown) can be applied over the contact level dielectric layer 73, and can be lithographically patterned to form openings overlying the drain structures 63. An anisotropic etch can be performed to transfer the pattern in the photoresist layer through the contact level dielectric layer 73 to form memory contact via cavities that extend through the contact level dielectric layer 73. The memory contact via cavities can be filled with at least one conductive material. Excess portions of the at least one conductive material can be removed from above a horizontal plane including a top surface of the contact level dielectric layer 73. Each remaining continuous portion of the at least one conductive material constitutes a memory contact via structure 88, which contacts a top surface of an underlying drain region 63.

In addition, word line contact via structures 86 can be formed through the retro-stepped dielectric material portion 65. The word line contact via structures 86 can extend through the contact level dielectric layer 73, the insulating cap layer 70, and the retro-stepped dielectric material portion 65 onto respective top surfaces of the electrically conductive layers 46 that function as control gate electrodes, drain select gate electrodes, or source select gate electrodes.

Further, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A. If desired, the memory contact via structures 88 and/or word line contact via structures to word lines/control gates 46 may also be formed during the same step as structures 8G, 8A.

The exemplary structure of the present disclosure can include a monolithic three-dimensional memory device. The monolithic three-dimensional memory device comprises a stack of alternating layers comprising insulating layers 32 and electrically conductive layers 46 and located over a substrate (9, 10) including a semiconductor material layer 10; a memory opening 49 vertically extending through the stack of alternating layers (32, 42); a memory film 50 located at a periphery of the memory opening 49; a metal dichalcogenide channel layer 60 extending through the memory opening 49 and located inside the memory film 50; and a dielectric core 62 located inside the metal dichalcogenide channel 60.

A drain region 63 contacting an upper end of the metal dichalcogenide channel 60 can be provided. In one embodiment, the drain region 63 can include an annular doped metal dichalcogenide drain portion 631 as illustrated in FIGS. 3K, 4C, and 5A. In one embodiment, the drain region 63 can further include a stack of a first metal layer 632 and a second metal layer 634 surrounded by the annular doped metal dichalcogenide drain portion 631; and a doped semiconductor drain portion 630 surrounded by the stack of the first metal layer 632 and the second metal layer 634 as illustrated in FIG. 4C. In another embodiment, the drain region 63 can include a doped semiconductor drain portion 630 contacting an inner sidewall of the annular doped metal dichalcogenide drain portion 631 as illustrated in FIG. 3K.

In another embodiment, the drain region 63 can contact a sidewall of the metal dichalcogenide channel 60 as illustrated in FIGS. 3J, 4D, and 5B. In one embodiment, the drain region comprises a stack of a first metal layer 632 and a second metal layer 634, and the first metal layer 632 can contact the sidewall of the metal dichalcogenide channel 60 as illustrated in FIGS. 4D and 5B. In one embodiment, the drain region 63 can comprise a doped semiconductor material portion 630 surrounded by the stack of the first metal layer 632 and the second metal layer 634 as illustrated in FIG. 4D. In one embodiment, the drain region 63 can comprise a doped semiconductor material portion 630 contacting the sidewall of the metal dichalcogenide channel 60 as illustrated in FIG. 3J.

In one embodiment, an epitaxial channel portion 11 can be located at a lower end of the memory opening 49, and can be epitaxially aligned to the semiconductor material layer 10. The metal dichalcogenide channel 60 can contact a top surface of the epitaxial channel portion 11. The memory film 50 comprises, from outside to inside, a blocking dielectric layer 502, a charge storage layer 504, and a tunneling dielectric layer 506. The innermost layer of the tunneling dielectric layer 506 can comprise a high-k dielectric material. In one embodiment, the innermost layer of the tunneling dielectric layer 506 can comprise a hafnium oxide, aluminum oxide or hafnium aluminum oxide layer. In one embodiment, an interfacial dielectric layer 522 comprising a high-k dielectric material can be provided, which can contact an inner sidewall of the metal dichalcogenide channel 60 and an outer sidewall of the dielectric core 62. In one embodiment, the interfacial dielectric layer 522 can comprise a hafnium oxide, aluminum oxide or hafnium aluminum oxide.

In one embodiment, the metal dichalcogenide can comprise $Mo_{1-x}W_xS_{2-y-z}Se_yTe_z$, in which x is a number in a range from, and including, 0 to, and including 1, y is a number in a range from, and including, 0 and to, and including, 2, and z is a number in a range from, and including, 0 and to, and including, 2. In another embodiment, the metal dichalcogenide can comprise $Mo_{1-x}W_xS_{2-y}Se_y$, wherein x is a number in a range from, and including, 0 to, and including 1, and y is a number in a range from, and including, 0 and to, and including, 2. In one embodiment, the metal dichalcogenide can have a substantially uniform thickness in a range from 1 monolayer to 8 monolayers of $Mo_{1-x}W_xS_{2-y}Se_y$, and can provide a two-dimensional electron gas with quantum confinement along a radial direction of the memory opening.

In one embodiment, the memory device of the present disclosure can be a monolithic three-dimensional memory device comprising a vertical NAND device located over the substrate (9, 10), and the electrically conductive layers 46 can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of metal dichalcogenide channels. At least one end portion of each of the plurality of metal dichalcogenide channels extends substantially perpendicular to a top surface of the substrate (9, 10). In one embodiment, the plurality of metal dichalcogenide channels can be connected in a parallel connection to a common horizontal semiconductor channel portion that is a portion of the semiconductor material layer 10 between a source region 61 and the epitaxial channel portions 11, the epitaxial channel portions 11, and the vertical metal dichalcogenide channels 60 that are portions of the memory stack structures 55. The array of monolithic three-dimensional NAND strings can comprise a plurality of charge storage elements (which can be embodied as sections of a charge storage layer 504 that is present within each memory stack structure 55). Each charge storage element can be located adjacent to a respective one of the plurality of metal dichalcogenide channels, i.e., adjacent to a respective vertical metal dichalcogenide channel 60. The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

The devices of the present disclosure can thus provide high mobility charge carrier transport by employing a two-dimensional quantum confinement within a metal dichalcogenide channel in a vertical memory device. The high mobility transport of electrons can be advantageously employed to increase the on-current of a memory stack structure, and to increase the signal-to-noise ratio during the read operation of the memory stack structure.

Specifically, a three dimensional NAND device with a metal dichalcogenide channel (e.g., MoS2 channel) may have show superior cell characteristics, such as a high cell current, sharp Id-Vg (small sub-threshold slope) and resulting higher cell performance. The low leakage and low gate induced drain leakage ("GIDL") may result in lower power and less program and read disturb.

The lower leakage, hence better boosting and less program disturb may lead to smaller power consumption. Additionally or alternatively, operation voltages can be reduced, thus cutting power consumption To further increase mobility in the channel, a high-k dielectric (e.g., hafnium oxide, aluminum oxide or hafnium aluminum oxide) may be used as the inner-most tunneling dielectric layer to improve the interface with the channel, which may boost the device mobility. In addition to improving mobility in the channel, the high-k metal oxide layer(s) may improve gate-channel coupling and control, and lead to higher cell current and better cell performance.

An electron mobility around and above 200 cm2/Vs is a 10-20 time improvement compared to polysilicon. Likewise an on/off ratio of $1\times10^8$ or better, and very small sub-threshold slope (e.g., ~80 mV/sec) may lead to improved device performance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
    a stack of alternating layers comprising insulating layers and electrically conductive layers and located over a substrate;
    a memory opening vertically extending through the stack of alternating layers;
    a memory film located at a periphery of the memory opening;
    a metal dichalcogenide channel extending through the memory opening and located inside the memory film; and
    a drain region contacting at least one of an upper end and a sidewall of the metal dichalcogenide channel,
    wherein the monolithic three-dimensional memory device comprises at least one feature selected from:

a first feature that the drain region further comprises an annular doped metal dichalcogenide drain portion;
a second feature that the drain region contacts the upper end of the metal dichalcogenide channel; and
a third feature that the drain region contacts the sidewall of the metal dichalcogenide channel.

2. The monolithic three-dimensional memory device of claim 1, wherein the monolithic three-dimensional memory device comprises the second feature.

3. The monolithic three-dimensional memory device of claim 1, wherein the monolithic three-dimensional memory device comprises the third feature.

4. The monolithic three-dimensional memory device of claim 1, wherein the monolithic three-dimensional memory device comprises the first feature.

5. The monolithic three-dimensional memory device of claim 4, wherein the drain region further comprises at least one metal or metal alloy layer surrounded by the annular doped metal dichalcogenide drain portion to provide an Ohmic contact with the annular doped metal dichalcogenide drain portion.

6. The monolithic three-dimensional memory device of claim 5, wherein the at least one metal or metal alloy layer comprises at least one of Ti, Au, Ni, In and alloys thereof.

7. The monolithic three-dimensional memory device of claim 4, wherein the drain region further comprises:
a stack of a first metal layer and a second metal layer surrounded by the annular doped metal dichalcogenide drain portion; and
a doped semiconductor drain portion surrounded by the stack of the first metal layer and the second metal layer.

8. The monolithic three-dimensional memory device of claim 4, wherein the drain region further comprises a doped semiconductor drain portion contacting an inner sidewall of the annular doped metal dichalcogenide drain portion.

9. A monolithic three-dimensional memory device comprising:
a stack of alternating layers comprising insulating layers and electrically conductive layers and located over a substrate;
a memory opening vertically extending through the stack of alternating layers;
a memory film located at a periphery of the memory opening; and
a metal dichalcogenide channel extending through the memory opening and located inside the memory film,
wherein the monolithic three-dimensional memory device comprises at least one feature selected from:
a first feature that the monolithic three-dimensional memory device further comprises a single crystal silicon epitaxial channel portion that is located at a lower end of the memory opening and epitaxially aligned to a semiconductor material layer of the substrate, wherein the metal dichalcogenide channel contacts a top surface of the epitaxial channel portion;
a second feature that the memory film comprises, from outside to inside, a blocking dielectric layer, a charge storage layer, and a tunneling dielectric layer, and an innermost layer of the tunneling dielectric layer comprises a high-k dielectric material having a dielectric constant greater than 7.9;
a third feature that the monolithic three-dimensional memory device further comprises a dielectric core located inside the metal dichalcogenide channel, and an interfacial dielectric layer comprising a high-k dielectric material having a dielectric constant greater than 7.9 and contacting an inner sidewall of the metal dichalcogenide channel and an outer sidewall of the dielectric core;
a fourth feature that the metal dichalcogenide channel comprises 1 to 8 molecular monolayers of $Mo_{1-x}W_x S_{2-y-z}Se_y Te_z$, wherein x is a number in a range from, and including, 0 to, and including 1, y is a number in a range from, and including, 0 and to, and including, 2, and z is a number in a range from, and including, 0 and to, and including, 2, wherein the metal dichalcogenide channel comprises 1 molecular monolayer to 3 molecular monolayers of $Mo_{1-x}W_x S_{2-y}Se_y$, which provides a two-dimensional electron gas with quantum confinement along a radial direction of the memory opening, the molecular monolayer comprises a metal atomic monolayer located between first and second chalcogen atomic monolayers, the metal atoms in the molecular monolayer are bound to chalcogen atoms in the molecular monolayer by intra molecular monolayer covalent bonds, and the molecular monolayers are bound to adjacent molecular monolayers by inter molecular monolayer van der Waals forces which are weaker than the intra molecular monolayer covalent bonds; and
a fifth feature that:
the monolithic three-dimensional memory device comprises a vertical NAND device located over the substrate;
the electrically conductive layers comprise, or are electrically connected to, respective word lines of the vertical NAND device;
the substrate comprises a silicon substrate;
the vertical NAND device comprises an array of monolithic three-dimensional NAND strings located over the silicon substrate;
at least one memory cell in a first device level of the array of monolithic three-dimensional array of NAND strings is located over another memory cell in a second device level of the array of monolithic three-dimensional array of NAND strings;
the silicon substrate contains an integrated circuit comprising a driver circuit for the memory device located thereon; and
the array of monolithic three-dimensional NAND strings comprises:
a plurality of metal dichalcogenide channels, wherein at least one end portion of each of the plurality of metal dichalcogenide channels extends substantially perpendicular to a top surface of the substrate;
a plurality of charge storage elements, each charge storage element located adjacent to a respective one of the plurality of metal dichalcogenide channels; and
a plurality of control gate electrodes having a strip shape extending substantially parallel to the top surface of the substrate, the plurality of control gate electrodes comprise at least a first control gate electrode located in a first device level and a second control gate electrode located in a second device level.

10. The monolithic three-dimensional memory device of claim 9, wherein the monolithic three-dimensional memory device comprises the first feature.

11. The monolithic three-dimensional memory device of claim 9, wherein the monolithic three-dimensional memory device comprises the fourth feature.

12. The monolithic three-dimensional memory device of claim 9, wherein the monolithic three-dimensional memory device comprises the fifth feature.

13. The monolithic three-dimensional memory device of claim 9, wherein the monolithic three-dimensional memory device comprises the second feature.

14. The monolithic three-dimensional memory device of claim 13, wherein the high-k dielectric material comprises aluminum oxide, hafnium oxide or hafnium aluminum oxide.

15. The monolithic three-dimensional memory device of claim 9, wherein the monolithic three-dimensional memory device comprises the third feature.

16. The monolithic three-dimensional memory device of claim 15, wherein the high-k dielectric material comprises aluminum oxide, hafnium oxide or hafnium aluminum oxide.

17. A method of forming a monolithic three-dimensional memory device, comprising:
  forming a stack of alternating layers comprising first material layers and second material layers over a substrate;
  forming a memory opening through the stack of alternating layers;
  forming a memory film in the memory opening; and
  forming a metal dichalcogenide channel extending through the memory opening on an inner sidewall of the memory film,
wherein the method further comprises at least one feature selected from:
  a first feature that the method further comprises forming a drain region that contacts at least one of an upper end and a sidewall of the metal dichalcogenide channel by forming an annular doped metal dichalcogenide drain portion and at least one metal or metal alloy layer in Ohmic contact with at least one of an upper end and a sidewall of the annular doped metal dichalcogenide drain portion;
  a second feature that the method further comprises forming a single crystal silicon epitaxial channel portion epitaxially aligned to a single crystal silicon semiconductor material layer at a lower end of the memory opening, wherein the metal dichalcogenide channel is formed directly on a top surface of the single crystal silicon epitaxial channel portion;
  a third feature that the memory film comprises, from outside to inside, a blocking dielectric layer, a charge storage layer, and a tunneling dielectric layer, and an innermost layer of the tunneling dielectric layer comprises a high-k dielectric material having a dielectric constant greater than 7.9;
  a fourth feature that the method further comprises forming an interfacial dielectric layer comprising a high-k dielectric material having a dielectric constant greater than 7.9 on an inner sidewall of the metal dichalcogenide layer, and forming a dielectric core within a cavity laterally surrounded by the interfacial dielectric layer;
  a fifth feature that the metal dichalcogenide channel comprises 1 to 8 molecular monolayers of $Mo_{1-x}W_x S_{2-y-z}Se_yTe_z$, wherein x is a number in a range from, and including, 0 to and including 1, y is a number in a range from, and including, 0 to, and including, 2, and z is a number in a range from, and including, 0 and to, and including, 2, the metal dichalcogenide comprises 1 molecular monolayer to 3 molecular monolayers of $Mo_{1-x}W_xS_{2-y}Se_y$, which provides a two-dimensional electron gas with quantum confinement along a radial direction of the memory opening, the molecular monolayer comprises a metal atomic monolayer located between first and second chalcogen atomic monolayers, the metal atoms in the molecular monolayer are bound to chalcogen atoms in the molecular monolayer by intra molecular monolayer covalent bonds, and the molecular monolayers are bound to adjacent molecular monolayers by inter molecular monolayer van der Waals forces which are weaker than the intra molecular monolayer covalent bonds;
  a sixth feature that the metal dichalcogenide channel is formed by depositing a molybdenum oxide or tungsten oxide layer by ALD and converting the molybdenum oxide or tungsten oxide layer to a molybdenum disulfide or tungsten disulfide layer by annealing in a sulfur containing atmosphere; and
  a seventh feature that:
    the monolithic three-dimensional memory device comprises a vertical NAND device located over the substrate;
    the electrically conductive layers comprise, or are electrically connected to, respective word lines of the vertical NAND device;
    the substrate comprises a silicon substrate;
    the vertical NAND device comprises an array of monolithic three-dimensional NAND strings located over the silicon substrate;
    at least one memory cell in a first device level of the array of monolithic three-dimensional array of NAND strings is located over another memory cell in a second device level of the array of monolithic three-dimensional array of NAND strings;
    the silicon substrate contains an integrated circuit comprising a driver circuit for the memory device located thereon; and
    the array of monolithic three-dimensional NAND strings comprises:
      a plurality of metal dichalcogenide channels, wherein at least one end portion of each of the plurality of metal dichalcogenide channels extends substantially perpendicular to a top surface of the substrate;
      a plurality of charge storage elements, each charge storage element located adjacent to a respective one of the plurality of metal dichalcogenide channels; and
      a plurality of control gate electrodes having a strip shape extending substantially parallel to the top surface of the substrate, the plurality of control gate electrodes comprise at least a first control gate electrode located in a first device level and a second control gate electrode located in a second device level.

18. The method of claim 17, wherein the method comprises the second feature.

19. The method of claim 17, wherein the method comprises the fifth feature.

20. The method of claim 17, wherein the method comprises the sixth feature.

21. The method of claim 17, wherein the method comprises the seventh feature.

22. The method of claim 17, wherein the method comprises the third feature.

23. The method of claim 22, wherein the high-k dielectric material comprises aluminum oxide, hafnium oxide or hafnium aluminum oxide.

24. The method of claim 17, wherein the method comprises the fourth feature.

25. The method of claim 24, wherein the high-k dielectric material comprises aluminum oxide, hafnium oxide or hafnium aluminum oxide.

26. The method of claim 17, wherein the method comprises the first feature.

27. The method of claim 26, further comprising forming a doped semiconductor material portion within a region laterally surrounded by the annular doped metal dichalcogenide drain portion as another component of the drain region.

28. The method of claim 26, wherein the at least one metal or metal alloy layer comprises at least one of Ti, Au, Ni, In and alloys thereof.

29. The method of claim 28, wherein the at least one metal or metal alloy layer comprises at least one of:
   a layer stack including a titanium layer and a nickel layer;
   a layer stack including a titanium layer, a nickel layer, and a gold layer;
   a nickel silicide layer; and
   an alloy layer including a material selected from a titanium-gold alloy, a nickel-gold alloy, and a titanium-nickel-gold alloy.

30. The method of claim 28, wherein the at least one metal or metal alloy layer comprises a stack of a first metal layer and a second metal layer.

31. The method of claim 30, further comprising forming a doped semiconductor material portion within a region laterally surrounded by the stack of the first metal layer and the second metal layer as another component of the drain region.

* * * * *